(12) United States Patent
Gillingham et al.

(10) Patent No.: US 11,669,248 B2
(45) Date of Patent: Jun. 6, 2023

(54) CLOCK MODE DETERMINATION IN A MEMORY SYSTEM

(71) Applicant: Mosaid Technologies Incorporated, Ottawa (CA)

(72) Inventors: Peter B. Gillingham, Ottawa (CA); Graham Allan, Stittsville (CA)

(73) Assignee: Mosaid Technologies Incorporated, Ottawa (CA)

(*) Notice: Subject to any disclaimer, the term of this patent is extended or adjusted under 35 U.S.C. 154(b) by 0 days.

(21) Appl. No.: 17/731,408

(22) Filed: Apr. 28, 2022

(65) Prior Publication Data

US 2023/0046725 A1 Feb. 16, 2023

Related U.S. Application Data

(60) Continuation of application No. 16/950,204, filed on Nov. 17, 2020, now Pat. No. 11,347,396, which is a
(Continued)

(51) Int. Cl.
*G11C 8/00* (2006.01)
*G06F 3/06* (2006.01)
(Continued)

(52) U.S. Cl.
CPC ............ *G06F 3/061* (2013.01); *G06F 3/0655* (2013.01); *G06F 3/0688* (2013.01);
(Continued)

(58) Field of Classification Search
CPC ...... G06F 3/061; G06F 3/0655; G06F 3/0688; G06F 13/1694
(Continued)

(56) References Cited

U.S. PATENT DOCUMENTS 3,648,255 A   3/1972   Beausoleil et al.
5,093,807 A   3/1992   Hashimoto et al.
(Continued)

FOREIGN PATENT DOCUMENTS

EP   0818734 B1   1/1998
JP   0391195 A    4/1991
(Continued)

OTHER PUBLICATIONS

Philips Semiconductors, "The I2C-BUS Specification Version 2.1", Document Order No. 9398 393 40011, Jan. 1, 2000, pp. 146.
(Continued)

*Primary Examiner* — Vu A Le
(74) *Attorney, Agent, or Firm* — Conversant IP Management Corp.

(57) ABSTRACT

A clock mode configuration circuit for a memory device is described. A memory system includes any number of memory devices serially connected to each other, where each memory device receives a clock signal. The clock signal can be provided either in parallel to all the memory devices or serially from memory device to memory device through a common clock input. The clock mode configuration circuit in each memory device is set to a parallel mode for receiving the parallel clock signal, and to a serial mode for receiving a source synchronous clock signal from a prior memory device. Depending on the set operating mode, the data input circuits will be configured for the corresponding data signal format, and the corresponding clock input circuits will be either enabled or disabled. The parallel mode and the serial mode is set by sensing a voltage level of a reference voltage provided to each memory device.

18 Claims, 15 Drawing Sheets

Related U.S. Application Data continuation of application No. 16/654,477, filed on Oct. 16, 2019, now Pat. No. 10,866,739, which is a continuation of application No. 16/184,607, filed on Nov. 8, 2018, now Pat. No. 10,489,057, which is a continuation of application No. 15/957,120, filed on Apr. 19, 2018, now Pat. No. 10,140,028, which is a continuation of application No. 15/655,336, filed on Jul. 20, 2017, now Pat. No. 9,971,518, which is a continuation of application No. 15/378,650, filed on Dec. 14, 2016, now Pat. No. 9,740,407, which is a continuation of application No. 15/183,162, filed on Jun. 15, 2016, now Pat. No. 9,552,889, which is a continuation of application No. 14/720,317, filed on May 22, 2015, now Pat. No. 9,384,847, which is a continuation of application No. 14/491,440, filed on Sep. 19, 2014, now Pat. No. 9,042,199, which is a continuation of application No. 14/158,215, filed on Jan. 17, 2014, now Pat. No. 8,854,915, which is a continuation of application No. 13/871,487, filed on Apr. 26, 2013, now Pat. No. 8,644,108, which is a continuation of application No. 13/006,005, filed on Jan. 13, 2011, now Pat. No. 8,432,767, which is a division of application No. 12/032,249, filed on Feb. 15, 2008, now Pat. No. 7,885,140.

(60) Provisional application No. 60/902,003, filed on Feb. 16, 2007.

(51) Int. Cl.
  *G06F 13/16* (2006.01)
  *G11C 7/10* (2006.01)
  *G11C 7/22* (2006.01)
  *G11C 16/10* (2006.01)
  *G11C 16/28* (2006.01)
  *G11C 16/32* (2006.01)
  *G11C 16/04* (2006.01)
  *G11C 14/00* (2006.01)
  *H03K 5/00* (2006.01)

(52) U.S. Cl.
  CPC ........ *G06F 13/1694* (2013.01); *G11C 7/1045* (2013.01); *G11C 7/1078* (2013.01); *G11C 7/1093* (2013.01); *G11C 7/22* (2013.01); *G11C 14/0018* (2013.01); *G11C 16/0483* (2013.01); *G11C 16/10* (2013.01); *G11C 16/28* (2013.01); *G11C 16/32* (2013.01); *H03K 2005/00247* (2013.01); *Y02D 10/00* (2018.01)

(58) Field of Classification Search
  USPC ..................................................... 365/233.1
  See application file for complete search history.

(56) References Cited

U.S. PATENT DOCUMENTS

| | | |
|---|---|---|
| 5,204,669 A | 4/1993 | Dorfe et al. |
| 5,243,703 A | 9/1993 | Farmwald et al. |
| 5,373,464 A | 12/1994 | Takatori et al. |
| 5,442,644 A | 8/1995 | Heflin et al. |
| 5,453,947 A | 9/1995 | Seta et al. |
| 5,530,828 A | 6/1996 | Kaki et al. |
| 5,557,221 A | 9/1996 | Taguchi et al. |
| 5,586,309 A | 12/1996 | Lin |
| 5,629,897 A | 5/1997 | Iwamoto et al. |
| 5,666,322 A | 9/1997 | Conkle |
| 5,729,683 A | 3/1998 | Le et al. |
| 5,773,968 A | 6/1998 | Kondo et al. |
| 5,778,419 A | 7/1998 | Hansen et al. |
| 5,796,673 A | 8/1998 | Foss et al. |
| 5,802,399 A | 9/1998 | Yomoto et al. |
| 5,809,515 A | 9/1998 | Kaki et al. |
| 5,818,783 A | 10/1998 | Kim |
| 5,859,809 A | 1/1999 | Kim |
| 5,880,998 A | 3/1999 | Tanimura et al. |
| 5,917,759 A | 6/1999 | Akashi |
| 5,949,252 A | 9/1999 | Taguchi |
| 5,982,309 A | 11/1999 | Xi et al. |
| 5,991,232 A | 11/1999 | Matsumura |
| 5,991,889 A | 11/1999 | Hikichi et al. |
| 6,002,638 A | 12/1999 | John |
| 6,026,465 A | 2/2000 | Mills et al. |
| 6,088,254 A | 7/2000 | Kermani |
| 6,094,375 A | 7/2000 | Lee |
| 6,104,225 A | 8/2000 | Taguchi et al. |
| 6,111,807 A | 8/2000 | Ooishi |
| 6,118,729 A | 9/2000 | Hirabayashi et al. |
| 6,125,078 A | 9/2000 | Ooishi et al. |
| 6,145,050 A | 11/2000 | Kaki et al. |
| 6,191,987 B1 | 2/2001 | Ogawa |
| 6,205,083 B1 | 3/2001 | Foss et al. |
| 6,212,591 B1 | 4/2001 | Kaplinsky |
| 6,236,249 B1 | 5/2001 | Choi et al. |
| 6,335,901 B1 | 1/2002 | Morita et al. |
| 6,337,832 B1 | 1/2002 | Ooishi et al. |
| 6,356,484 B2 | 3/2002 | Dosaka et al. |
| 6,388,945 B2 | 5/2002 | Aikawa |
| 6,438,060 B1 | 8/2002 | Li et al. |
| 6,480,026 B2 | 11/2002 | Andrews et al. |
| 6,480,946 B1 | 11/2002 | Tomishima et al. |
| 6,549,974 B2 | 4/2003 | Kaki et al. |
| 6,567,904 B1 | 5/2003 | Khandekar et al. |
| 6,570,800 B2 | 5/2003 | Tanaka et al. |
| 6,636,110 B1 | 10/2003 | Ooishi et al. |
| 6,668,292 B2 | 12/2003 | Meyer et al. |
| 6,687,184 B2 | 2/2004 | Johnson et al. |
| 6,696,862 B2 | 2/2004 | Choi et al. |
| 6,732,224 B2 | 5/2004 | Hashimoto et al. |
| 6,754,133 B2 | 6/2004 | Morita et al. |
| 6,788,606 B2 | 9/2004 | Fibranz et al. |
| 6,789,137 B2 | 9/2004 | Itoh |
| 6,795,906 B2 | 9/2004 | Matsuda |
| 6,825,698 B2 | 11/2004 | Wang et al. |
| 6,937,680 B2 | 8/2005 | Fong et al. |
| 6,965,964 B2 | 11/2005 | Lee et al. |
| 6,945,149 B2 | 12/2005 | Mikhalev et al. |
| 7,031,221 B2 | 4/2006 | Mooney et al. |
| 7,130,958 B2 | 10/2006 | Chou et al. |
| 7,139,308 B2 | 11/2006 | Doblar et al. |
| 7,236,109 B1 | 6/2007 | Duewer et al. |
| 7,296,173 B2 | 11/2007 | Nambu et al. |
| 7,376,028 B2 | 5/2008 | Tokito |
| 7,394,712 B2 | 7/2008 | Do |
| 7,660,186 B2 | 2/2010 | Yeung et al. |
| 7,693,002 B2 | 4/2010 | Lin |
| 7,697,369 B2 | 4/2010 | Koshizuka |
| 7,885,140 B2 | 2/2011 | Gillingham et al. |
| 8,054,695 B2 | 11/2011 | Kang |
| 8,432,767 B2 | 4/2013 | Gillingham et al. |
| 8,644,108 B2 | 2/2014 | Gillingham et al. |
| 8,854,915 B2 | 10/2014 | Gillingham et al. |
| 9,042,199 B2 | 5/2015 | Gillingham et al. |
| 9,384,847 B2 | 7/2016 | Gillingham et al. |
| 9,552,889 B2 | 1/2017 | Gillingham et al. |
| 9,740,407 B2 | 8/2017 | Gillingham et al. |
| 9,971,518 B2 | 5/2018 | Gillingham et al. |
| 10,140,028 B2 | 11/2018 | Gillingham et al. |
| 10,489,057 B2 | 11/2019 | Gillingham et al. |
| 10,866,739 B2 | 12/2020 | Gillingham et al. |
| 2002/0075989 A1 | 6/2002 | Joo |
| 2002/0126566 A1 | 9/2002 | Takeuchi |
| 2003/0009713 A1 | 1/2003 | Endou |
| 2003/0043684 A1 | 3/2003 | Johnson et al. |
| 2003/0135699 A1 | 7/2003 | Matsuzaki et al. |
| 2003/0147298 A1 | 8/2003 | Ooishi et al. |
| 2004/0148482 A1 | 7/2004 | Grundy et al. |
| 2004/0186956 A1 | 9/2004 | Perego et al. |
| 2005/0146980 A1 | 7/2005 | Mooney et al. |

(56) References Cited

U.S. PATENT DOCUMENTS

| | | |
|---|---|---|
| 2006/0067123 A1 | 3/2006 | Jigour et al. |
| 2006/0250883 A1 | 11/2006 | Szczypinski |
| 2006/0268624 A1 | 11/2006 | Jang |
| 2006/0268642 A1 | 11/2006 | Chen et al. |
| 2007/0076479 A1 | 4/2007 | Kim et al. |
| 2007/0076502 A1 | 4/2007 | Pyeon et al. |
| 2007/0109833 A1 | 5/2007 | Pyeon et al. |
| 2007/0143506 A1* | 6/2007 | Raju .......... G06F 13/4059 710/35 |
| 2007/0168631 A1 | 7/2007 | Heo |
| 2007/0233903 A1 | 10/2007 | Pyeon |
| 2007/0233917 A1 | 10/2007 | Pyeon et al. |
| 2007/0234071 A1 | 10/2007 | Pyeon et al. |
| 2007/0283182 A1 | 12/2007 | Defazio et al. |
| 2008/0016269 A1 | 1/2008 | Chow et al. |
| 2008/0049505 A1 | 2/2008 | Kim et al. |
| 2008/0140899 A1 | 6/2008 | Oh et al. |
| 2008/0155179 A1 | 6/2008 | Pyeon et al. |
| 2008/0165589 A1 | 7/2008 | Hung et al. |
| 2008/0181214 A1 | 7/2008 | Pyeon et al. |
| 2008/0192649 A1 | 8/2008 | Pyeon et al. |
| 2020/0110535 A1 | 4/2020 | Gillingham et al. |
| 2021/0132799 A1 | 5/2021 | Gillingham et al. |

FOREIGN PATENT DOCUMENTS

| | | |
|---|---|---|
| JP | 06103762 | 4/1994 |
| JP | 06104725 | 4/1994 |
| JP | 08147967 A | 6/1996 |
| JP | 09007395 | 1/1997 |
| JP | 09063277 | 3/1997 |
| JP | 09091047 | 4/1997 |
| JP | 10020974 | 1/1998 |
| JP | 11007768 | 1/1999 |
| JP | 1188146 A | 3/1999 |
| JP | 11066862 | 3/1999 |
| JP | 2000031807 A | 1/2000 |
| JP | 2000067577 A | 3/2000 |
| JP | 2000090696 A | 3/2000 |
| JP | 2000148656 A | 5/2000 |
| JP | 2000149554 A | 5/2000 |
| JP | 2000163965 A | 6/2000 |
| JP | 2000215689 A | 8/2000 |
| JP | 2001044825 | 2/2001 |
| JP | 2001067870 A | 3/2001 |
| JP | 2002007200 A | 1/2002 |
| JP | 2002271189 A | 9/2002 |
| JP | 2003036674 A5 | 2/2003 |
| JP | 2003085973 A | 3/2003 |
| JP | 2003233998 A | 8/2003 |
| JP | 2004287691 A | 10/2004 |
| WO | 2002099810 A1 | 12/2002 |

OTHER PUBLICATIONS

Samsung Electronics Co. Ltd., "256 M ×8 BIT/128M ×16 BIT/ 512M ×8 BIT NAND Flash Memory", K9K4G08U1M, K9F2G08UOM, K9F2G16UOM, Revision 1.0, May 6, 2005, pp. 1-41.
Samsung Electronics Co. Ltd., "1G ×8 BIT/2G ×8 BIT NAND Flash Memory", K9F8G08UXM, Technical Specification, Mar. 31, 2007, pp. 1-54.
Samsung Electronics Co. Ltd., "1G ×8 BIT/2G ×8 BIT/4G ×8 BIT NAND Flash Memory", K9XXG08UXA, Jul. 18, 2006, pp. 1-50.
"Hypertransport TM I/O Link Specification", Revision 3.00a, Document #HTC20051222-0046-0017, Nov. 22, 2006, pp. 1-443.
O'Malley Andrew, "International Patent Application No. PCT/CA2008/000292", Search Report, dated Jun. 6, 2008, pp. 55-57.
Imamiya, K. et al., "A 125-MM2 1-GB NAND Flash Memory with 10-MBYTE/S Program Speed", IEEE Journal of Solid-State Circuits, vol. 37, No. 11, Nov. 2002, pp. 1493-1501.
Lee, June et al., "High-Performance 1-GB NAND Flash Memory with 012-um Technology", IEEE Journal of Solid-State Circuits, vol. 37, No. 1, Nov. 2002, pp. 1502-1509.
Cho, T. et al. "A Dual-Mode NAND Flash Memory: 1GB Multilevel and High Performance 512-MB Single-Level Modes", IEEE Journal of Solid-State Circuits, vol. 36, No. 11, Nov. 2001, pp. 1700-1706.
Toshiba, "16 GBIT (2G ×8BIT) CMOS NAND E2PROM (Multi-level-Cell), TC58NVG4D1DTG00" Nov. 9, 2006, pp. 1-64.
"IEEE Standard for High-Bandwidth Memory Interface Based on Scalable Coherent Interface (SCI) Signaling Technology (RAMLINK)", IEEE STD 1596.4-1996, The Institute of Electrical Electronics Engineers, Inc. Mar. 19, 1996, pp. 98.
"8-MEGIBIT 2.5-Volt only or 2.7-Volt only Data Flash, Technical Specification", Rev 2225H-DFLSH-10/04, AT45DB081B, Oct. 2004, pp. 1-33.
Integrated Device Technology, Inc., "2.5V Differential 1:5 Clock Buffer Terabuffer", IDT5T915, Feb. 1, 2003, pp. 1-19.
"2GBIT (256 ×8 Bits) CMOS NAND E3PROM", TH58NVG1S3AFT05, Toshiba MOS Digital Integrated Circuit Silicon Gate CMOS, May 19, 2003, pp. 1-32.
"16 MBIT SPI Serial Flash, SST25VF016B, Preliminary Specification", Silicon Storage Technology Inc., Apr. 2005, pp. 1-28.
Lee, June et al., "A 90-NM CMOS 1.8-V 2-GB NAND Flash Memory for Mass Storage Applications", IEEE Journal of Solid-State Circuits, vol. 38, No. 11, Nov. 2003, pp. 1934-1942.
Le, Vu Anh, "U.S. Appl. No. 12/032,249—Notice of Allowance" dated Sep. 28, 2010, pp. 1-8.
Tanzawa, T. et al., "Circuit Techniques for a 1.8-V-ONLY NAND Flash Memory", IEEE Journal of Solid-State Circuits, vol. 37, No. 1, Jan. 1, 2002, pp. 84-89.
Takeuchi K. et al., "A 56NM CMOS 99MM2 8GB Multi-Level NAND Flash Memory with 10MB/S Program Throughput Solid-State Circuits", 2006 IEEE International Conference Digest of Technical Papers, Session 7, ISBN: 1-4244-0079-1, Feb. 6, 2006, pp. 10.
Byeon D. et al., "An 8GB Multi-Level NAND Flash Memory with 63NM STI CMOS Process Technology", IEEE International Solid-State Circuits Conference, Feb. 7, 2005, pp. 46-47.
Lee, S. et al., "A 3.3V 4GB Four-Level NAND Flash Memory with 90NM CMOS Technology ISSCC 2004/Session 2Non-Volatile Memory/ 2.7", IEEE International Solid-State Circuits Conference Digest of Technical Papers, vol. 1, XPO10722148, ISBN: 0-7803-8267-6, Feb. 16, 2004, 10 pgs.
Samsung Electronics Co. Ltd., "2G ×8BIT NAND Flash Memory, K9XXG08UXM; K9GAG08UOM", Sep. 21, 2006, pp. 1-48.
Hara T. et al, "A 146-MM2 8-GB Multi-Level NAND Flash Memory with 70-NM CMOS Technology", IEEE Journal of Solid State Circuits, vol. 41, No. 1, Jan. 2006, pp. 161-169.
Samsung Electronics Co. Ltd., "512M ×8 BIT/ 1G ×8 BIT NAND Flash Memory, K9XXG08UXA", Mar. 7, 2006 pp. 1-43.
Diamond, Steven L., "Synclink: High-Speed DRAM for the Future", Micro Standards, IEEE Micro, Dec. 1996, pp. 74-75.
Hara, T. et al., "A 146MM2 8GB NAND Flash Memory with 70NM CMOS Technology, ISSCC Session 2—Non-Volatile Memory 2.1", IEEE International Solid-State Circuits Conference, Feb. 7, 2005, pp. 44-45 and 584.
Samsung Electronics Co. Ltd., "2G ×8 Bit NAND Flash Memory", K0GAG08U0M, Apr. 12, 2006, pp. 1-48.
Atmel, "8-megabit 2.5-vold Only or 2.7-vol Only DataFlash" Technical Specification, Atmel, Rev. 2225H-DFLSH, Oct. 2004.
International Search Report dated Jun. 6, 2008 from International Application PCT/CA2008/000292, p. 2.

* cited by examiner

CLOCK MODE DETERMINATION IN A MEMORY SYSTEM

CROSS REFERENCE TO RELATED APPLICATIONS

This application is a Continuation application of U.S. patent application Ser. No. 16/950,204, filed Nov. 17, 2020, which is a Continuation application Ser. No. 16/654,477, filed on Oct. 16, 2019, now issued as U.S. Pat. No. 10,866,739, which is a Continuation application of Ser. No. 16/184,607, filed on Nov. 8, 2018, now issued as U.S. Pat. No. 10,489,057, which is a Continuation application of U.S. patent application Ser. No. 15/957,120, filed on Apr. 19, 2018, now issued as U.S. Pat. No. 10,140,028 on Nov. 27, 2018, which is a Continuation application of U.S. patent application Ser. No. 15/655,336, filed on Jul. 20, 2017, now issued as U.S. Pat. No. 9,971,518 on May 15, 2018, which is a Continuation application of U.S. patent application Ser. No. 15/378,650, filed on Dec. 14, 2016, now issued as U.S. Pat. No. 9,740,407 on Aug. 22, 2017, which is a Continuation application of U.S. patent application Ser. No. 15/183,162, filed on Jun. 15, 2016, now issued as U.S. Pat. No. 9,552,889 on Jan. 24, 2017, which is a Continuation application of U.S. patent application Ser. No. 14/720,317, filed on May 22, 2015, now issued as U.S. Pat. No. 9,384,847 on Jul. 5, 2016, which is a continuation application of U.S. patent application Ser. Ser. No. 14/491,440, filed on Sep. 19, 2014, now issued as U.S. Pat. No. 9,042,199 on May 26, 2015, which is a Continuation application of U.S. patent application Ser. Ser. No. 14/158,215, filed on Jan. 17, 2014, now issued as U.S. Pat. No. 8,854,915 on Oct. 7, 2014, which is a Continuation application of U.S. patent application Ser. No. 13/871,487 filed on Apr. 26, 2013, now issued as U.S. Pat. No. 8,644,108 on Feb. 4, 2014, which is a Continuation application of U.S. patent application Ser. No. 13/006,005 filed on Jan. 13, 2011, now issued as U.S. Pat. No. 8,432,767 on Apr. 30, 2013, which is a Divisional application of U.S. patent application Ser. No. 12/032,249 filed on Feb. 15, 2008, now issued as U.S. Pat. No. 7,885,140 on Feb. 8, 2011, which claims the benefit of U.S. Provisional Patent Application Ser. No. 60/902,003 filed on Feb. 16, 2007, which are hereby incorporated by reference.

BACKGROUND

Flash memory is a commonly used type of non-volatile memory in widespread use as mass storage for consumer electronics, such as digital cameras and portable digital music players for example. The density of a presently available Flash memory component, consisting of 2 stacked dies, can be up to 32 Gbits (4 GB), which is suitable for use in popular USB Flash drives, since the size of one Flash component is small.

The advent of 8 mega pixel digital cameras and portable digital entertainment devices with music and video capabilities has spurred demand for ultra-high capacities to store the large amounts of data, which cannot be met by the single Flash memory device. Therefore, multiple Flash memory devices are combined together into a memory system to effectively increase the available storage capacity. For example, Flash storage densities of 20 GB may be required for such applications.

FIG. 1 is a block diagram of a prior art flash memory system 10 integrated with a host system 12. Flash memory system 10 includes a memory controller 14 in communication with host system 12, and multiple non-volatile memory devices 16. The host system 12 includes a processing device such as a microcontroller, microprocessor, or a computer system. The Flash memory system 10 of FIG. 1 is configured to include one channel 18, where memory devices 16 are connected in parallel to channel 18. Those skilled in the art will understand that the memory system 10 can have more or less than four memory devices connected to it.

Channel 18 includes a set of common buses, which include data and control lines that are connected to all its corresponding memory devices. Each memory device is enabled/disabled with respective chip select signals CE #1, CE #2, CE #3 and CE #4, provided by memory controller 14. The "#" indicates that the signal is an active low logic level signal. The memory controller 14 is responsible for issuing commands and data, via the channel 18, to a selected memory device based on the operation of the host system 12. Data read from the memory devices is transferred via the channel 18 back to the memory controller 14 and host system 12. Operation of flash memory system 10 can be asynchronous or synchronous. FIG. 1 illustrates an example of a synchronous system that uses a clock CLK, which is provided in parallel to each memory device 16. Flash memory system 10 is generally referred to as a multi-drop configuration, in which the memory devices 16 are connected in parallel with respect to channel 18.

In Flash memory system 10, non-volatile memory devices 16 may be (but not necessarily) substantially identical to each other, and are typically implemented as NAND flash memory devices. Those skilled in the art will understand that flash memory is organized into banks, and each bank is organized into blocks to facilitate block erasure. Most commercially available NAND flash memory devices are configured to have two banks of memory.

There are specific issues that will adversely impact performance of the system. The configuration of Flash memory system 10 imposes physical performance limitations. With the large number of parallel signals extending across the system, the signal integrity of the signals they carry will be degraded by crosstalk, signal skew, and simultaneous switching noise (SSN). Power consumption in such a configuration becomes an issue as each signal track between the flash controller and flash memory devices is frequently charged and discharged for signaling. With increasing system clock frequencies, the power consumption will increase.

There is also a practical limit to the number of memory devices which can be connected in parallel to the channel since the drive capability of a single memory device is small relative to the loading of the long signal tracks. Furthermore, as the number of memory devices increase, more chip enable signals (CE #) are required, and the clock signal CLK will need to be routed to the additional memory devices. Clock performance issues due to extensive clock distribution are well known in the art, which would need to be addressed. Therefore, in order to accommodate a memory system having a large number of memory devices, either a controller having more channels must be used, or and/or the system will need to be clocked at a lower frequency. A controller configured to have multiple channels and additional chip enable signals increases the cost of the memory system. Otherwise, the memory system is limited to a small number of memory devices.

Therefore, it is desirable to provide a memory system device architecture capable of high speed operation while overcoming issues associated with the prior art memory system having memory devices connected in parallel to each other.

BRIEF DESCRIPTION OF THE DRAWINGS

Embodiments of the clock mode circuits will now be described, by way of example only, with reference to the attached Figures, wherein.

DETAILED DESCRIPTION

Figure 1:
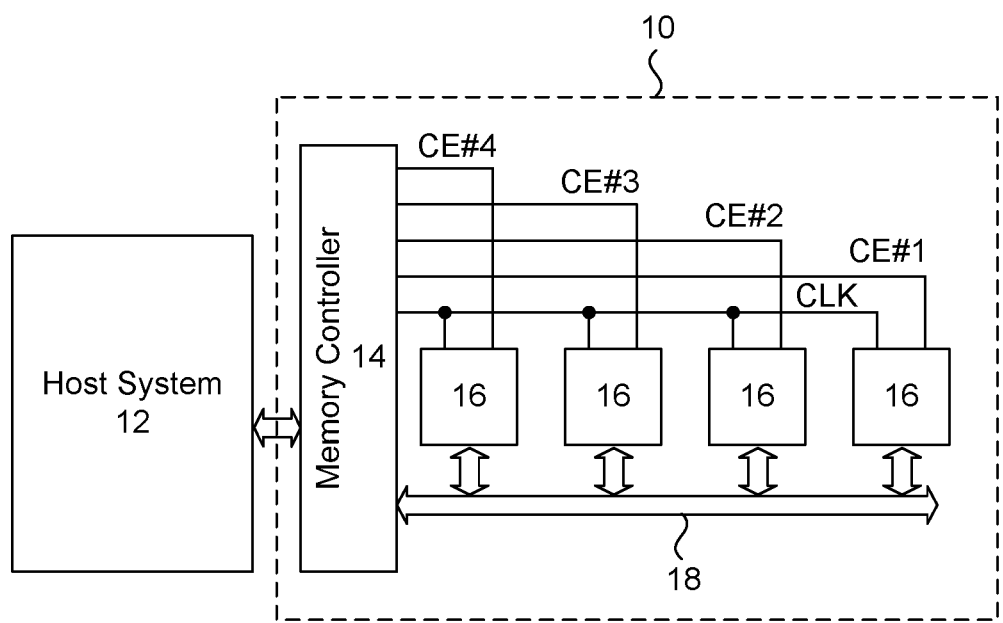
FIG. 1 is a block diagram of a prior art Flash memory system.

In a first aspect, there is provided a semiconductor device for receiving a clock and input data. The semiconductor device includes a configurable input circuit operable in a first mode for receiving coincident edges of the clock and the input data, and for providing shifted clock edges positioned within a data valid window for sampling the input data. The configurable input circuit is operable in a second mode for receiving non-coincident edges of the clock and the input data for sampling the input data. In an embodiment of the present aspect, the semiconductor device further includes an input pin for providing a voltage to the configurable input circuit for setting the first mode and the second mode. The input pin includes a reference voltage pin set to one of low and high power supply levels for setting the second mode, and a reference voltage level for setting the first mode. The reference voltage level can be between the low and high power supply levels, and is used by the configurable input circuit to sense logic levels of the input data.

In further embodiments of the present aspect, the configurable input circuit includes a single ended input buffer and a differential input buffer. The single ended input buffer is coupled to a data input pin for receiving the input data, and is enabled in the second mode and disabled in the first mode. The differential input buffer is coupled to the data input pin for receiving the input data, and is enabled in the first mode for sensing logic levels of the input data relative to the voltage. Alternately, the configurable input circuit includes a clock synthesizer for providing the shifted clock edges in response to the clock. The clock synthesizer includes one of a delay locked loop and a phase locked loop, or the clock synthesizer can be disabled in the second mode.

In a second aspect, the present invention provides a configurable memory device. The configurable memory device includes a mode setter, a clock switch, and a configurable data input/output buffer. The mode setter senses a voltage level of a reference voltage input port and provides a mode selection signal corresponding to the sensed voltage level. The clock switch is coupled to a clock input port for receiving at least one of parallel complementary clock signals and serial complementary clock signals. The clock switch generates complementary internal clock signals corresponding to the parallel complementary clock signals in response to a first logic state of the mode selection signal, or the serial complementary clock signals in response to a second logic state of the mode selection signal. The configurable data input/output buffer is coupled to a data input port and the reference voltage input port for sensing data received on the data input port relative to the voltage level in response to the second logic state of the mode selection signal. In an embodiment of the present aspect, the mode setter includes a sense circuit and a latch. The sense circuit compares the voltage level to a preset reference voltage, and provides a sense output corresponding to the voltage level relative to the preset reference voltage. The latch latches the sense output and provides the mode selection signal having one of the first logic state and the second logic state.

In the current embodiment, the sense circuit includes a reference voltage circuit and a comparator. The reference voltage circuit provides the preset reference voltage and the comparator provides the sense output in response to the voltage level and the preset reference voltage. The reference voltage circuit includes a voltage divider coupled between VDD and VSS, and a power shut-off device for cutting off current through the voltage divider after a predetermined period of time. The mode setter includes a delay circuit for turning off the power shut-off device after the predetermined period of time when a reset signal is driven to an inactive logic state. The delay circuit includes an n-bit counter enabled when the reset signal is at the inactive logic state for driving a most significant bit to an active logic state. The most significant bit is driven to the active logic state when $2^n$ active edges of a clock signal are counted, where n is an integer value greater than 1, such that the delay circuit generates a disable signal corresponding to the most significant bit being at the active logic state for turning off the power shut-off device.

In yet another embodiment of the present aspect, the clock switch includes a clock input buffer, a clock generator and a clock output buffer. The clock input buffer provides the buffered parallel complementary clock signals in response to the first logic state of the mode selection signal, and provides a sensed clock signal corresponding to the serial complementary clock signals in response to the second logic state of the mode selection signal. The clock generator generates the complementary internal clock signals in response to either the buffered parallel complementary clock signals when the mode selection signal is at the first logic state, or the sensed clock signal when the mode selection signal is at the second logic state. The clock output buffer drives the complementary internal clock signals through clock output ports when the mode selection signal is at the second logic state. The clock input buffer includes a comparator and a pair of buffers. The comparator is enabled in response to the mode selection signal at the second logic state for providing the sensed clock signal in response to the serial complementary clock signals. The pair of buffers are enabled in response to the mode selection signal at the second logic state for providing the buffered parallel complementary clock signals in response to the parallel complementary clock signals. The clock output buffer includes a pair of drivers enabled in response to the mode selection signal at the second logic state for driving the complementary internal clock signals through the clock output ports.

In a further embodiment, the clock generator includes a clock synthesizer and a switch circuit. The clock synthesizer provides a first clock signal and a second clock signal shifted 180 degrees relative to the first clock signal, in response to the sensed clock signal. The switch circuit passes the first clock signal and the second clock signal as the complementary internal clock signals when the mode selection circuit is at the second logic state. The switch circuit passes the buffered parallel complementary clock signals as the complementary internal clock signals when the mode selection circuit is at the second logic state. The clock synthesizer can be one of a phase locked loop and a delay locked loop. The clock synthesizer provides a third clock signal and a fourth clock signal, where the third clock signal is shifted 90 degrees relative to the first clock signal and the fourth clock signal is shifted 180 degrees relative to the third clock signal. The clock generator further includes a phase selector circuit for selectively passing either the complementary internal clock signals or the third and fourth clock signals to the clock output buffer.

According to another embodiment, the configurable data input/output buffer includes a data input buffer for selectively providing input data corresponding to either sensed data resulting from a comparison between the data and the voltage level, or buffered data corresponding to the data, in response to the mode selection signal. The data input buffer includes a comparator and a buffer. The comparator is enabled when the mode selection signal is at the second logic state for providing the input data in response to the voltage level and a voltage of the data. The buffer is enabled when the mode selection signal is at the first logic state for providing the buffered data. The configurable data input/output buffer can further include a data switch for selectively passing one of the input data and local read data to a data output buffer.

In a third aspect, the present invention provides a method for configuring a clock operating mode of a memory device that receives a reference voltage for sensing input data. The method includes setting the reference voltage level; comparing the reference voltage to a preset reference voltage for generating a mode selection signal corresponding to the reference voltage relative to the preset reference voltage; and configuring a clock input buffer to receive either parallel complementary clock signals or serial complementary clock signals in response to the mode selection signal. In embodiments of the present aspect, the step of comparing includes latching the mode selection signal, and the step of comparing includes disabling a sense circuit used for comparing the reference voltage to the preset reference voltage after a predetermined delay. The predetermined delay is determined by counting $2^n$ clock edges after deasserting a reset signal, and the preset reference voltage floats to a voltage supply while the reset signal is asserted.

In yet another embodiment of the present aspect, the step of configuring includes enabling a comparator receiving serial complementary clock signals and disabling buffers receiving parallel complementary clock signals in response to a first logic state of the mode selection signal. The step of enabling includes enabling a clock synthesizer for generating a first clock signal and a second clock signal shifted 180 degrees relative to the first clock signal, in response to a sensed clock signal from the comparator. The step of enabling a clock synthesizer includes providing as internal clock signals one of the first clock signal and the second clock signal and buffered parallel complementary clock signals corresponding to the parallel complementary clock signals, in response to the mode selection signal. The clock synthesizer generates a third clock signal and a fourth clock signal, where the third clock signal is shifted 90 degrees relative to the first clock signal and the fourth clock signal is shifted 180 degrees relative to the third clock signal. The step of configuring includes selectively passing one of the internal clock signals and the third and fourth clock signals in response to a phase selection signal.

In a fourth aspect, the present invention provides a memory system configurable to operate with one of parallel clock signals and serial clock signals. The memory system includes a memory controller and at least one serially connected memory device. The at least one memory device has clock input ports, a reference voltage input port, a mode setter, and a clock switch circuit. The clock input ports receive one of the parallel clock signals and the serial clock signals. The reference voltage input port receives a reference voltage set to one of a predetermined voltage level and a voltage supply level. The mode setter compares the reference voltage to the predetermined voltage level, and generates a mode selection signal corresponding to a result of the comparison. The clock switch circuit is coupled to the clock input ports for generating complementary internal clock signals corresponding to one of the parallel clock signals and the serial complementary clock signals, in response to the mode selection signal.

Figure 2A:
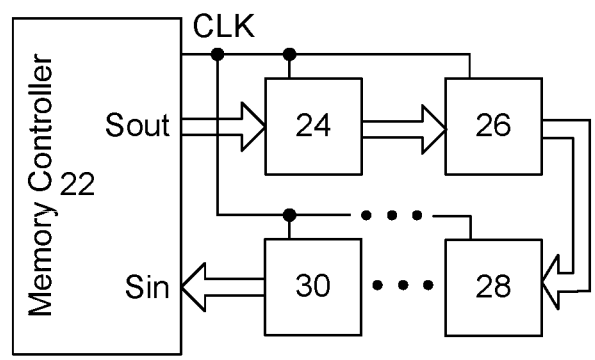
FIG. 2A is a general block diagram of a serial memory system receiving a clock signal in parallel.
Figure 2B:
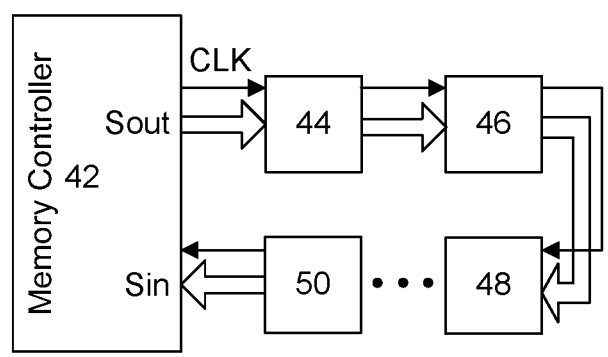
FIG. 2B is a general block diagram of a serial memory system receiving a clock signal serially.

A memory system that resolves many performance issues of the Flash memory system 10 of FIG. 1 is a serially connected memory system in which the memory devices are serially connected with each other and the memory controller in a ring topology configuration. FIGS. 2A and 2B are block diagrams illustrating the conceptual nature of a serial memory system. FIG. 2A is a block diagram of a serial memory system receiving a parallel clock signal while FIG. 2B is a block diagram of the same serial memory system of FIG. 2A receiving a source synchronous clock signal.

In FIG. 2A, the serial memory system 20 includes a memory controller 22 having at least one serial channel output port Sout and a serial channel input port Sin, and memory devices 24, 26, 28 and 30 that are connected in series. Input and output ports correspond to physical pins or connections interfacing the memory device to the system it is integrated with. In one embodiment, the memory devices can be flash memory devices. Alternately, the memory devices can be DRAM, SRAM or any other type of memory device provided it has a serial input/output interface compatible with a specific command structure, for executing commands or for passing through commands and data to the next memory device. The current example of FIG. 2A includes four memory devices, but alternate embodiments can include a single memory device, or any number of memory devices. Accordingly, if memory device 24 is the first device of serial memory system 100 as it is connected to Sout, then memory device 30 is the Nth or last device as it is connected to Sin, where N is an integer number greater than zero. Memory devices 26 to 28 are then intervening serially connected memory devices between the first and last memory devices. Each memory device can assume a distinct identification (ID) number, or device address (DA) upon power up initialization of the system, so that they are individually addressable. Commonly owned U.S. patent application Ser. No. 11/622,828 titled "APPARATUS AND METHOD FOR PRODUCING IDS FOR INTERCONNECTED DEVICES OF MIXED TYPE", U.S. patent application Ser. No. 11/750,649 titled "APPARATUS AND METHOD FOR ESTABLISHING DEVICE IDENTIFIERS FOR SERIALLY INTERCONNECTED DEVICES", U.S. patent application Ser. No. 11/692,452 titled "APPARATUS AND METHOD FOR PRODUCING DEVICE IDENTIFIERS FOR SERIALLY INTERCONNECTED DEVICES OF MIXED TYPE", U.S. patent application Ser. No. 11/692,446 titled "APPARATUS AND METHOD FOR PRODUCING IDENTIFIERS REGARDLESS OF MIXED DEVICE TYPE IN A SERIAL INTERCONNECTION", U.S. patent application Ser. No. 11/692,326 titled "APPARATUS AND METHOD FOR IDENTIFYING DEVICE TYPE OF SERIALLY INTERCONNECTED DEVICES" and U.S. patent application Ser. No. 11/771,023 titled "ADDRESS ASSIGNMENT AND TYPE RECOGNITION OF SERIALLY INTERCONNECTED MEMORY DEVICES OF MIXED TYPE" describe methods for generating device addresses for serially connected memory devices of a memory system, the contents of which are incorporated by reference in its entirety.

Memory devices 24 to 30 are considered serially connected because the data input of one memory device is connected to the data output of a previous memory device, thereby forming a series-connection configuration, with the exception of the first and last memory devices in the chain. The channel of memory controller 22 includes data, address, command, and control information provided by separate pins or the same pins. For example, a data channel of any suitable data width will carry command, data and address information, while a control channel will carry control signal data. The embodiment of FIG. 2A includes one channel, where the one channel includes Sout and corresponding Sin ports. However, memory controller 22 can include any number of channels for accommodating separate memory device chains. In the example of FIG. 2A, the memory controller 22 provides a clock signal CLK, which is connected in parallel to all the memory devices.

In general operation, the memory controller 22 issues a command through its Sout port, which includes an operational code (op code), a device address, address information for reading or programming, and data for programming. The command is issued as a serial bitstream packet, where the packet can be logically subdivided into predetermined size segments, such as a byte for example. A bitstream is a sequence or series of bits provided over time. The command is received by the first memory device 24, which compares the device address to its assigned address. If the addresses match, then memory device 24 executes the command. Otherwise, the command is passed through its own output port to the next memory device 26, where the same procedure is repeated. Eventually, the memory device having the matching device address, referred to as a selected memory device, will execute the operation dictated by the command. If the command is to read data, the selected memory device will output the read data through its output port, which is serially passed through intervening memory devices until it reaches the Sin port of the memory controller 22. Since the commands and data are provided in a serial bitstream, the clock is used by each memory device for clocking in/out the serial bits and for synchronizing internal memory device operations. This clock is used by all the memory devices in the serial memory system 20.

Figure 10:
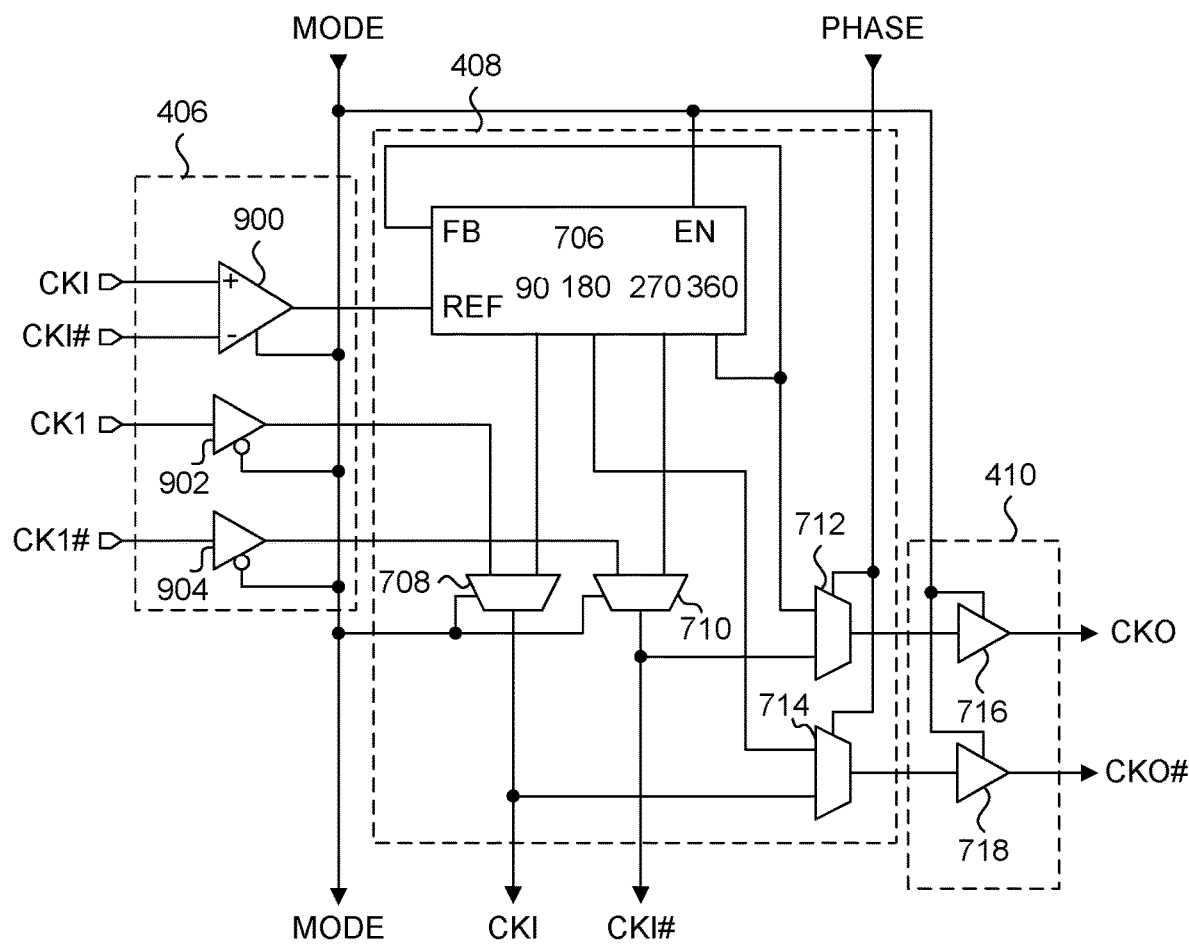
FIG. 10 is a schematic embodiment of an alternate clock switch circuit embodiment used in the memory devices shown in FIG. 9; and, FIG. 11 is a flow chart of a method for configuring an clock operating mode of a memory device.

The performance of serial memory system 20 is superior to that of the parallel memory system 10 shown in FIG. 10. The parallel distributed clock lines can provide a relatively relaxed clock frequency, thereby allowing memory system 20 to use low voltage CMOS unterminated full swing signaling to provide robust data communication. This is also referred to as LVTTL signaling. For example, assuming a 66 MHz clock is used and the serial memory system 20 includes four memory devices, the data rate per pin of one of the serially connected memory devices employing double data rate (DDR) signaling will be about 133 Mbps.

Serial memory system 40 of FIG. 2B is similar to serial memory system 20 of FIG. 2A, except that the clock signal CLK is provided serially to each memory device from an alternate memory controller 42 configured for providing the source synchronous clock signal CLK. Each memory device 44, 46, 48 and 50 will be configured to receive and pass the source synchronous clock CLK. In a practical implementation of serial memory system 40, the clock signal CLK is passed from one memory device to another via short signal lines. Therefore none of the clock performance issues related to the parallel clock distribution scheme are present, and CLK can operate at high frequencies. Accordingly, the serial memory system 40 can operate with greater speed than serial memory system 20 of FIG. 2A. For example, high speed transceiver logic (HSTL) signaling can be used to provide high performance data communication. In the HSTL signaling format, each memory device will receive a reference voltage that is used for determining a logic state of the incoming data signals. Another similar signaling format is the SSTL signaling format. Accordingly, the data and clock input circuits in the memory devices of serial memory systems 20 and 40 will be configured differently from each other.

While high speed serial memory systems are suitable for newer computing devices, there may be existing computing systems that do not require high speed operation, but can still benefit from the high memory capacity of a serial memory system. For example, the serial memory system can be modular, as disclosed in commonly owned U.S. patent application Ser. No. 11/843,440, where additional memory devices can be added to the memory system in order to expand the total memory capacity. On the other hand, it may not be cost effective to replace existing slower speed serial memory systems with the high speed memory systems. Therefore, both types of memory devices would have to be available for upgrading or assembling of both types of serial memory systems. However, persons skilled in the art will understand that it is not cost effective to manufacture two different types of memory devices, where one type is configured for interfacing with memory controller 22 while another type is configured for interfacing with memory controller 42.

Therefore, a clock mode configuration circuit for a configurable memory device is provided for allowing the configurable memory device to be used in both a parallel clocked memory system and a serially clocked memory system. Such a memory system includes any number of configurable memory devices serially connected to each other, where each configurable memory device receives a clock signal. The clock signal can be provided either in parallel to all the configurable memory devices or serially from one memory device to another through the same clock input. The clock mode configuration circuit in each configurable memory device is set to a parallel mode for receiving the parallel clock signal, and to a serial mode for receiving a source synchronous clock signal from a prior memory device or memory controller. Depending on the set operating mode, the data input circuits will be configured for a corresponding data signal format, and the corresponding clock input circuits will be either enabled or disabled. The parallel mode and the serial mode is set by sensing a reference voltage level provided to each memory device.

Figure 3A:
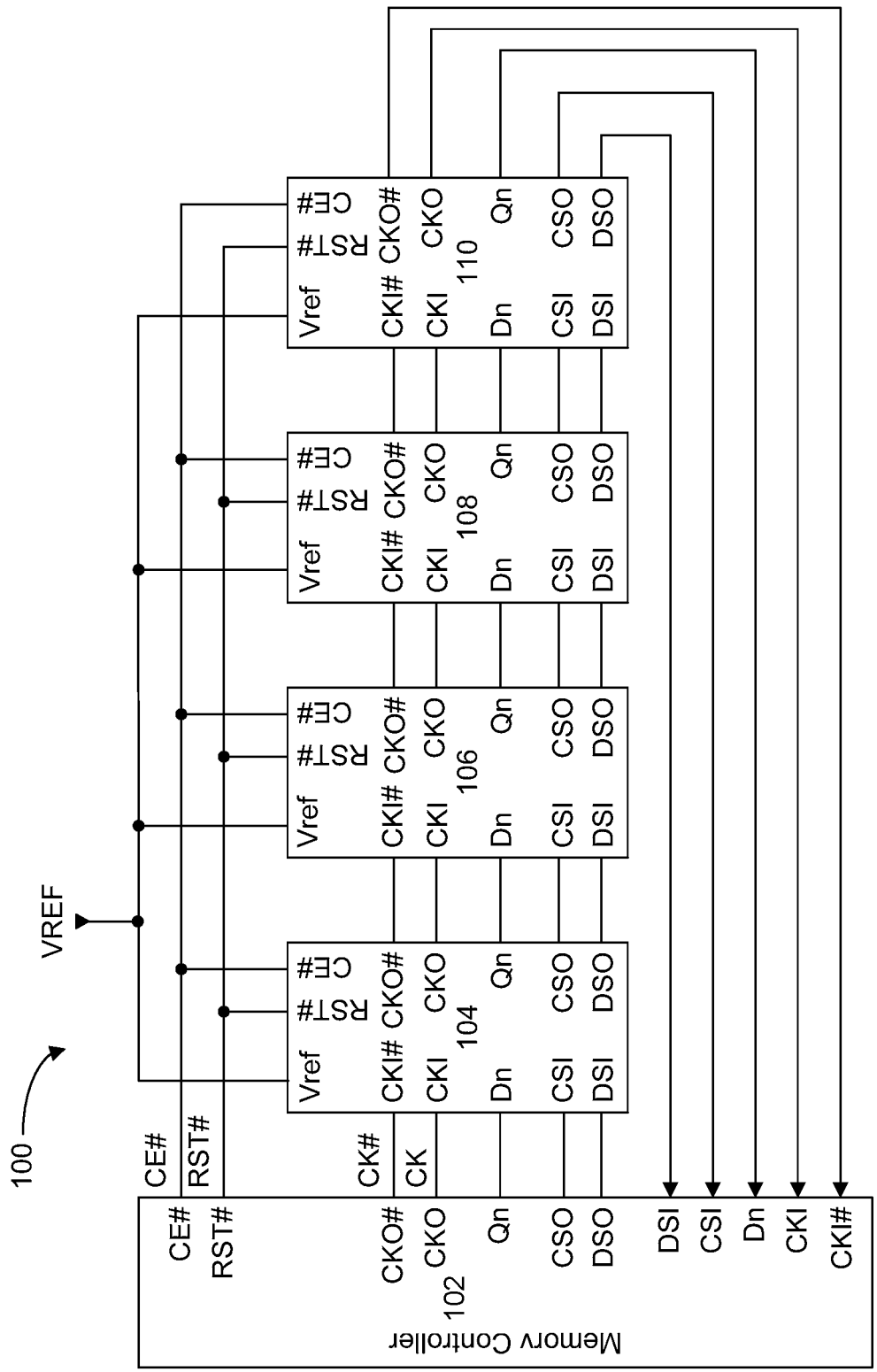
FIG. 3A is a block diagram of a serial memory system receiving clock signals serially, according to one embodiment.
Figure 3B:
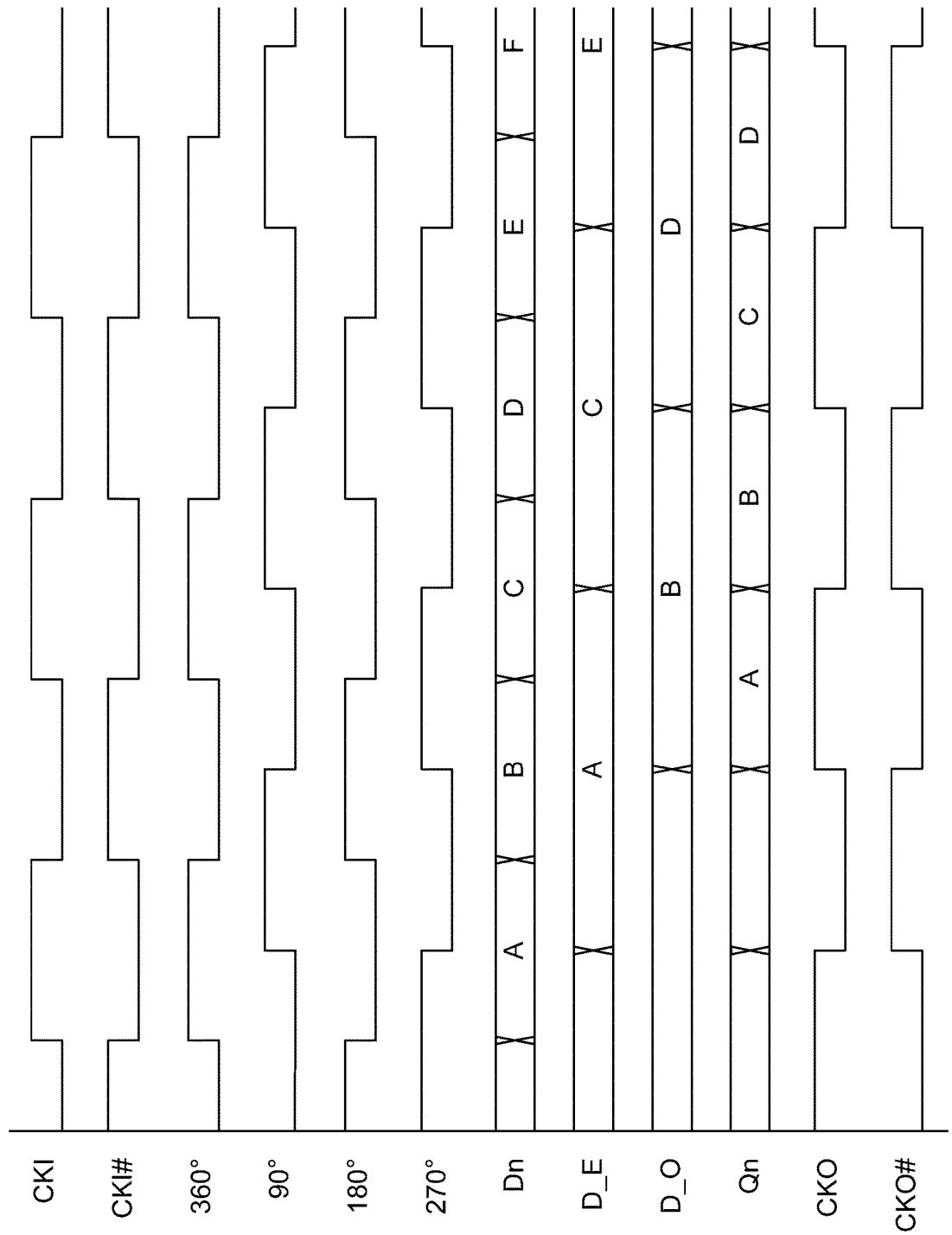
FIG. 3B is a timing diagram showing the operation of the memory system of FIG. 3A.
Figure 3C:
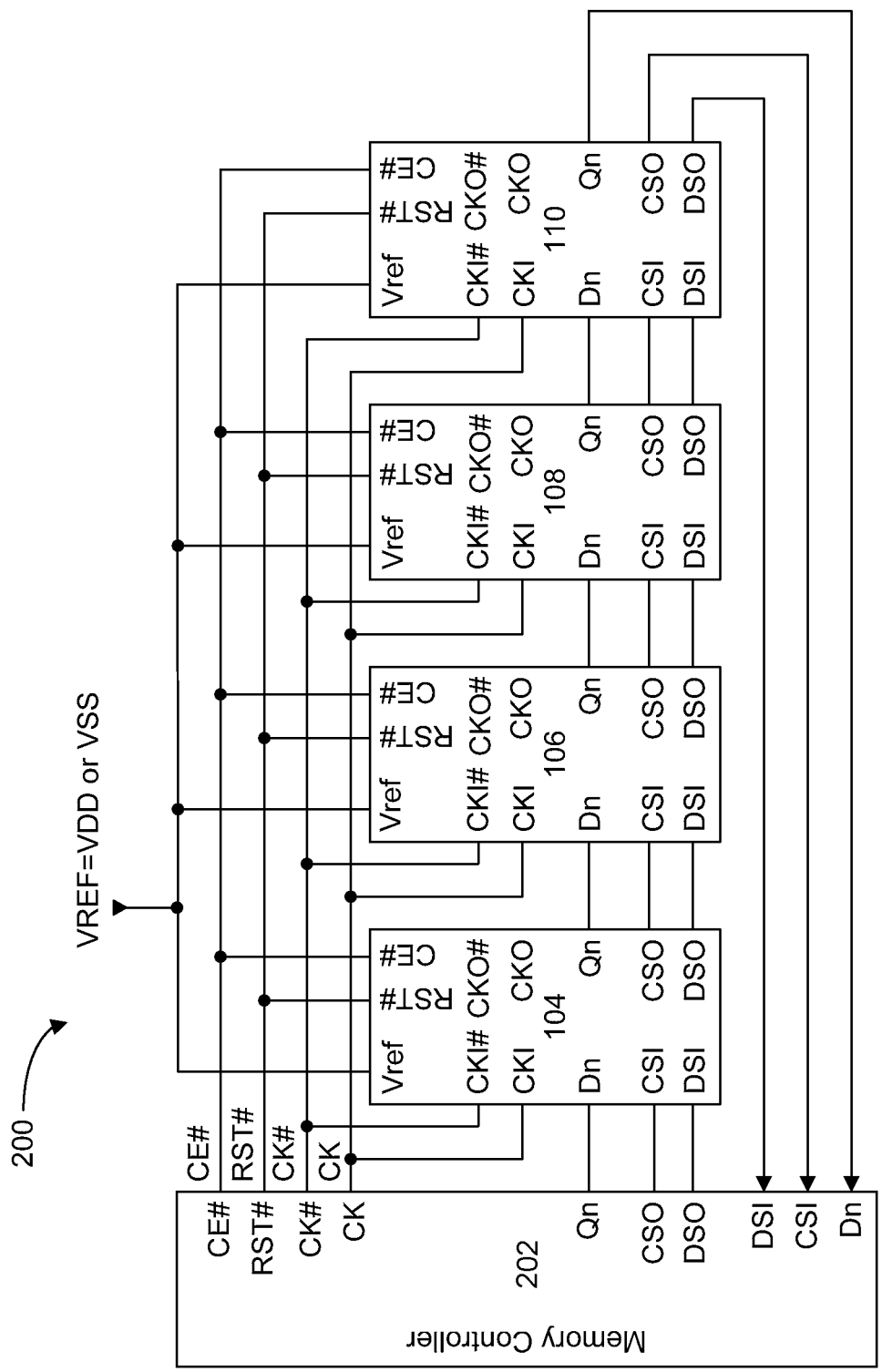
FIG. 3C is a block diagram of a serial memory system receiving clock signals in parallel, according to another embodiment.

FIGS. 3A and 3C are block diagrams of serial memory systems using the same type of memory device that includes embodiments of the clock mode configuration circuit, the details of which will be described later. The memory devices of the serial memory system of FIG. 3A receive the clock serially while the memory devices of the serial memory system of FIG. 3C receive the clock in parallel. In the memory system embodiments of FIGS. 3A and 3C, four memory devices are shown connected in series in a ring topology configuration with the memory controller, however any number of memory devices can be included in either serial memory system. The serial memory systems of FIGS. 3A and 3C illustrate that the same type of memory device can be used for both a parallel clocked system and a serially source synchronous clocked system, provided the memory devices have the clock mode configuration circuit.

In FIG. 3A, serial memory system 100 includes a memory controller 102 and four memory devices 104, 106, 108 and 110. The memory controller 102 provides control signals in parallel to the memory devices. These include the chip enable signal CE # and the reset signal RST #. In one example use of CE #, the device is enabled when CE # is at the low logic level. Once the memory device starts a program or erase operation, CE # can be de-asserted, or driven to a high logic level. In one example use of RST #, the memory device is set to a reset mode when RST # is at the low logic level. In the reset mode, the power is allowed to stabilize and the device prepares itself for operation by initializing all finite state machines and resetting any configuration and status registers to their default states. The memory controller 102 includes clock output ports CKO # and CKO for providing complementary clock signals CK and CK #, and clock input ports CKI # and CKI for receiving the complementary clock signals from the last memory device of the system. Each memory device will include a clock synthesizer, such as a DLL or a PLL for generating phases of the received clocks. Certain phases will be used to center the clock edges within the input data valid window internally to ensure reliable operation. Each memory device has clock output ports CKO # and CKO for passing the complementary clock signals to the clock input ports of the next memory device, and clock input ports CKI and CKI # for receiving the complementary clock signals from either the memory controller 102 or a previous memory device. The last memory device 110 provides the clock signals back to the memory controller 102.

The channel of memory controller 102 includes a data channel consisting of data output port Qn and data input port Dn, and a control channel consisting of a command strobe input CSI, a command strobe output CSO (echo of CSI), data strobe input DSI, and a data strobe output DSO (echo of DSI). Output port Qn and input port Dn can be one bit in width, or n bits in width where n is a non-zero integer, depending on the desired configuration. For example, if n is 1 then one byte of data is received after eight data latching edges of the clock. A data latching clock edge can be a rising clock edge for example in single data rate (SDR) operation, or both rising and falling edges of the clock for example in double data rate (DDR) operation. If n is 2 then one byte of data is received after four latching edges of the clock. If n is 4 then one byte of data is received after two latching edges of the clock. The memory device can be statically configured or dynamically configured for any width of Qn and Dn. Hence, in a configuration where n is greater than 1, the memory controller provides data in parallel bitstreams. CSI is used for latching command and write data appearing on the input port Dn, and has a pulse duration corresponding to the length of the command data received. More specifically, the command and write data will have a duration measured by a number of clock cycles, and the pulse duration of the CSI signal will have a corresponding duration. DSI is used for enabling the output port Qn buffer to output read data, and has a pulse duration corresponding to the length of the read data being requested.

Since the present embodiment of FIG. 3A is intended for high speed operation, a high speed signaling format, such as the HSTL signaling format by example, will be used. Accordingly, a reference voltage VREF is provided to each memory device which is used by each memory device to determine the logic level of the signals received at the Dn, CSI and DSI input ports. The reference voltage VREF may be generated by another circuit on the printed circuit board, for example, and is set to a predetermined voltage level based on the voltage swing of the HSTL signal. By example, VREF can be set to a mid-point voltage of the maximum voltage level of the HSTL signal. According to the present embodiment, setting VREF to the aforementioned predetermined voltage level will set the clock mode configuration circuit in a first operating mode in which the input circuits are set to receive HSTL input signals and the appropriate internal clock circuits will be generated. The first operating mode can be referred to as a high speed operating mode.

In a practical implementation of the embodiment of FIG. 3A, each memory device is positioned on a printed circuit board such that the distance and signal track between input and output ports is minimized. Alternately, the four memory devices can be implemented in a system in package module (SIP) which further minimizes signal track lengths. The memory devices can also be implemented as multiple SIP modules. Memory controller 102 and memory devices 104 to 110 are serially connected to form a ring topology, meaning that the last memory device 110 provides its outputs back to the memory controller 102. As such, those skilled in the art will understand that the distance between memory device 110 and memory controller 102 is easily minimized.

FIG. 3B is a timing diagram showing the general timing relationship between the input signals and output signals for each memory device in serial memory system 100 with some internal signals shown as well. In this diagram internal gate delays are assumed to be minimal, although in an actual system significant delays can be accommodated and will not affect functionality. Signal traces for received input clocks CKI and CKI #, input data Dn, output clocks CKO and CKO #, and output data Qn are shown in FIG. 3B, as are internally generated 90, 180, 270 and 360 degree phases of the received input clocks. Since each memory device operates at the double data rate, received data is buffered into an internal single data rate even data stream D_E and an internal single data rate odd data stream D_O. In the example of FIG. 3B, data "A", "B", "C", "D" and "E" are provided serially on the Dn input of the memory device, where each has a data input valid window corresponding to a rising and falling edge of CKI or CKI #. In other words, the input data and the clock edges are coincident with each other. Data "A", "C" and "E" are latched on each rising edge of the internal 90 degree clock and provided on the D_E data stream. Data "B" and "D" are latched on each rising edge of the internal 270 degree clock and provided on the D_O data stream. Assuming that the received input data on Dn is simply passed through to its Qn output, the double data rate output data Qn is generated from the even D_E data latched on each rising edge of the 270 degree clock output and the odd D_O data latched on each rising edge of the 90 degree clock output. As shown in FIG. 3B, CKO corresponds to the 270 degree clock output while CKO # corresponds to the 90 degree clock output.

In the presently shown embodiment of FIG. 3C, each memory device has the same serial input/output interface, which includes RST #, CE #, CKI # and CKI input ports for receiving the corresponding signals from the memory controller 202. The serial input/output interface further includes a data input port Dn, a data output port Qn, CSI, DSI, CSO and DSO ports. As shown in FIG. 3C, the Dn, CSI and DSI input ports for each memory device are connected to the Qn, CSO and DSO output ports respectively, of a previous memory device. Accordingly, the memory devices are considered serially connected to each other as each can pass command and read data to the next memory device in the chain.

In FIG. 3C, serial memory system 200 includes a memory controller 202 and the same memory devices 104, 106, 108 and 110 of FIG. 3A. The memory controller 202 will be configured to provide the same functionality as memory controller 102 of FIG. 3A except that the clock signals are provided in parallel, therefore the clock output ports CKO # and CKO of each memory device are unconnected. Furthermore, the signaling format for the data and the strobe signals will be different, such as the full swing un-terminated LVTTL signaling format by example. At lower clock frequencies, the LVTTL signaling format does not require the use of reference voltage VREF, thus VREF can be set to a voltage level other than the predetermined level used in the embodiment of FIG. 3A. For example, VREF can be set to either VDD or VSS. According to the present embodiment, setting VREF to VSS or some voltage other than the aforementioned predetermined voltage level will set the clock mode configuration circuit in a second operating mode in which the input circuits are set to receive LVTTL input signals and the appropriate internal clock circuits will be generated. The second operating mode can be referred to as a low speed operating mode. Accordingly, an advantage of using the existing VREF input of the memory devices to set the operating mode of the clock mode configuration circuit is that no additional pin and corresponding logic in the memory controllers is required for configuring the memory devices. Each memory device self-configures based on the voltage level of VREF, thereby reducing any design overhead in the memory controller. Furthermore, the same clock input ports CKI and CKI # can receive either the parallel clock signals or the serial clock signals, which minimizes the pin count of the memory device.

Figure 3D:
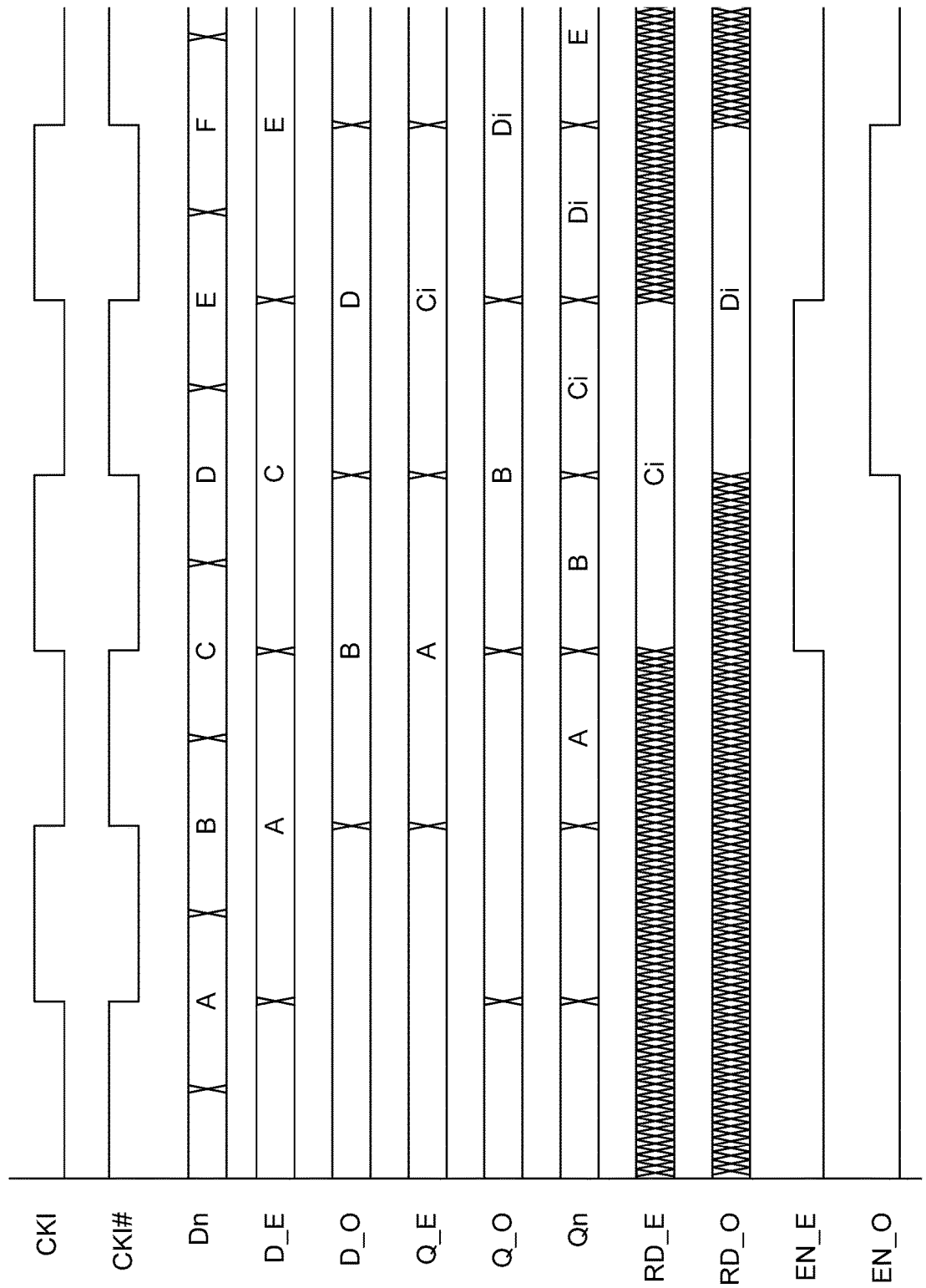
FIG. 3D is a timing diagram showing the operation of the memory system of FIG. 3C.

FIG. 3D is a timing diagram showing the general timing relationship between the input signals and output signals for each memory device in serial memory system 200 with some internal signals shown as well. In this diagram internal gate delays are assumed to be minimal, although in an actual system significant delays can be accommodated and will not affect functionality. Signal traces for received input clocks CKI and CKI #, input data Dn and output data Qn are shown in FIG. 3B. The memory devices do not have an internal clock synthesizer, and no output clocks CKO and CKO # are provided. Each memory device operates at the double data rate, hence received data is buffered into a single data rate even data stream D_E and a single data rate odd data stream D_O. In the example of FIG. 3D, data "A", "B", "C", "D" and "E" are provided serially on the Dn input of the memory device, and the rising and falling edges of CKI and CKI # are centered within each data input valid window. In the present example, internal read data "Ci" and "Di" will be provided to the output circuits of the memory device via RD_E and RD_O, in response to a read command received by the memory device. Accordingly, there is an even output data stream Q_E and an odd output data stream Q_O that will provide either the internal read data from RD_E and RD_O or external data from the D_E and D_O on the Qn output. More specifically, data from RD_E and RD_O will be provided on Q_E and Q_O in response to enable signals EN_E and EN_O at the high logic level.

Data "A", "C" and "E" are latched on each rising edge of CKI and provided on the D_E data stream. Data "B" and "D" are latched on each rising edge of CKI # and provided on the D_O data stream. While EN_E and EN_O are at the inactive low logic level, data "A" and "B" will be latched on the rising edges of CKI and CKI # and provided on D_E and D_O respectively. On the rising edge of CKI #, data "A" on D_E is latched and provided on Q_E, while data "B" on D_O is latched on the rising edge of CK and provided on Q_O. Data "A" and "B" are then provided on the Qn output on the rising edges of CKI # and CKI respectively. When EN_E is high, data "Ci" on RD_E is latched and provided on Q_E on the rising edge of CKI #. Subsequently, while EN_O is high, data "Di" on RD_O is latched and provided on Q_O on the rising edge of CKI. Data "Ci" and "Di" are then provided on the Qn output on the rising edges of CKI # and CKI respectively. When EN_E and EN_O fall to the low logic level, external data "E" will be latched onto Q_E and passed onto Qn. Delay through the output path of the device, the interconnection to the following device, and the input path of the following device will shift the Qn data stream so that the rising edge of CKI in the following device falls within the received Dn data stream bits A, Ci, and E, and the rising edge of CKI # in the following device falls within the received Dn data stream bits B and Di. Persons skilled in the art will ensure that the delay path from serial output Qn to serial input Dn is less than half a clock period.

According to an example embodiment, memory devices 104, 106, 108 and 110 can be any type of memory device having a serial input/output interface designed for serial interconnection with other memory devices. While memory devices 104, 106, 108 and 110 can be implemented as Flash memory devices, they can also be implemented as DRAM, SRAM or any other suitable type of volatile or non-volatile memory device. More specifically, other memory types can be adapted to operate with the serial input/output interface and configured to receive LVTTL input signals or HSTL input signals.

Figure 4:
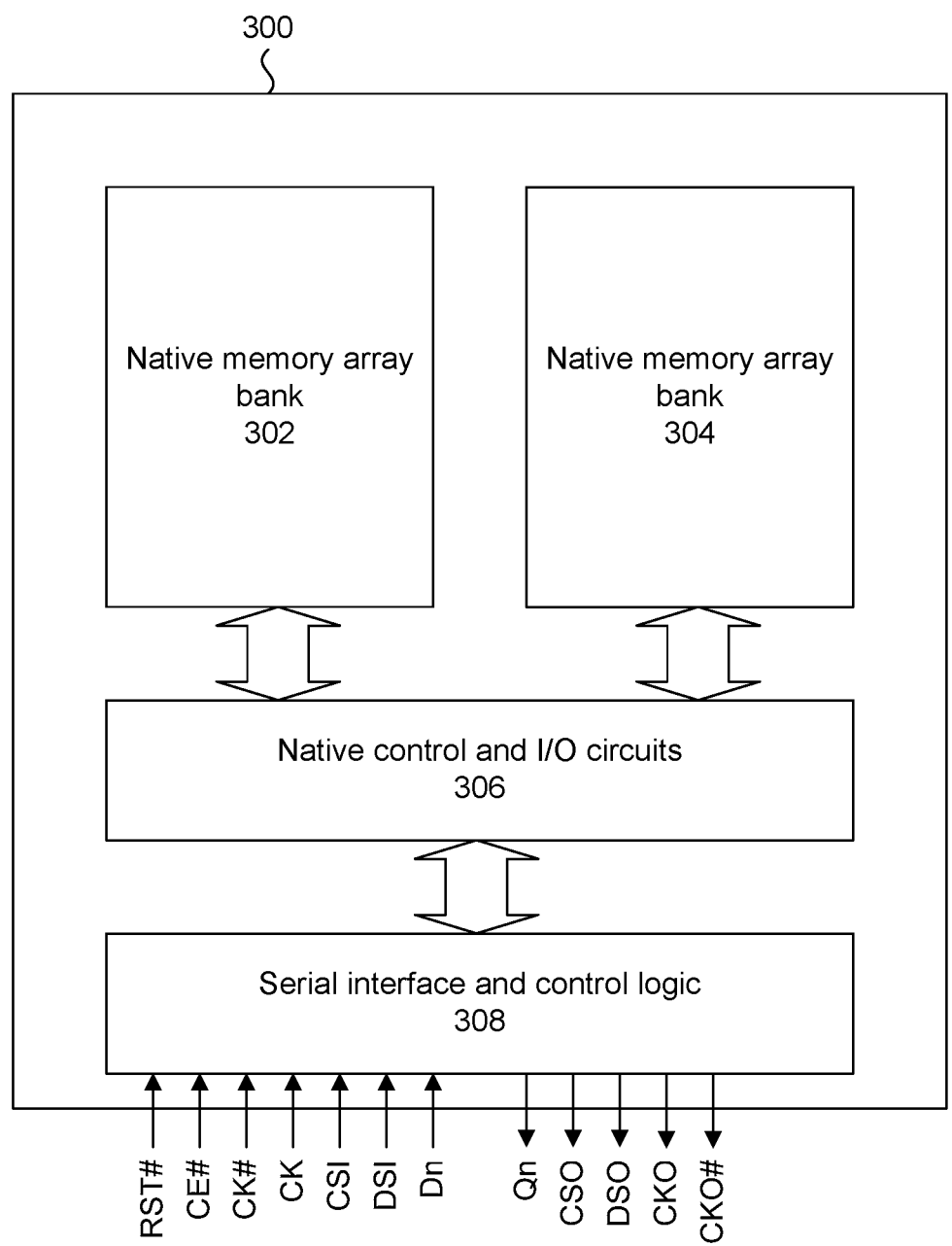
FIG. 4 is a block diagram of a memory device having a native core and a serial input/output interface suitable for use in the serial memory systems of FIGS. 3A and B.

FIG. 4 is a block diagram illustrating the conceptual organization of a generic memory device having a native core and a serial input/output interface suitable for use in the serial memory systems of FIGS. 3A and 3C. Memory device 300 includes a native memory core, which includes memory array banks 302 and 304, and native control and I/O circuits 306 for accessing the memory array banks 302 and 304. Those skilled in the art will understand that the memory array can be organized as a single memory bank or more than two memory banks. The native memory core can be DRAM, SRAM, NAND flash, or NOR flash memory based for example. Of course, any suitable emerging memory and its corresponding control circuits can be used. Accordingly, depending on the type of native memory core, circuit block 306 can include error correction logic, high voltage generators, refresh logic and any other circuit blocks that are required for executing the operations native to the memory type.

Typically, memory devices use command decoders for initializing the relevant circuits in response to a received command by asserting internal control signals. They will also include well known I/O circuitry for receiving and latching data, commands and addresses. According to the present embodiment, the existing I/O circuits are replaced with the serial interface and control logic block 308. In the present example, the serial interface and control logic block 308 receives RST #, CE #, CK #, CK, CSI, DSI and Dn inputs, and provides Qn, CSO, DSO, CKO and CKO # outputs.

The serial interface and control logic block 308 is responsible for various functions, as discussed in U.S. patent application Ser. No. 11/324,023. Example functions of serial interface and control logic block 308 include setting a device identifier number, passing data through to the next serially connected memory device, and decoding a received command for executing native operations. This circuit will be configured to receive commands serially, and will be configured to include additional commands specific to serial operation of the memory device, in addition to existing native commands specific for controlling core circuits. The command set can be expanded to execute features usable by the memory controller when the memory devices are serially connected. For example, status register information can be requested to assess the status of the memory device.

Therefore, the serial memory systems of FIGS. 3A and 3C can include a mix of memory device types, each providing different advantages for the greater system. Such a configuration having memory devices of mixed types is disclosed in U.S. Provisional patent application Ser. No. 60/868,773 filed Dec. 6, 2006, the disclosure of which is incorporated herein by reference in its entirety. Further details are such configurations are disclosed in U.S. patent application Ser. No. 11/771,023 titled "ADDRESS ASSIGNMENT AND TYPE RECOGNITION OF SERIALLY INTERCONNECTED MEMORY DEVICES OF MIXED TYPE", and in U.S. patent application Ser. No. 11/771,241 titled "SYSTEM AND METHOD OF OPERATING MEMORY DEVICES OF MIXED TYPE". For example, the high speed of DRAM memory can be used for caching operations while the non-volatility of flash memory can be used for low power mass data storage. Regardless of the type of memory device being used, each memory device is individually addressable to act upon a command because the serial interface and control logic block 306 is configured to receive commands according to a predetermined protocol. According to one embodiment, the previously discussed clock mode configuration circuit is implemented in the serial interface and control logic block 308.

Figure 5:
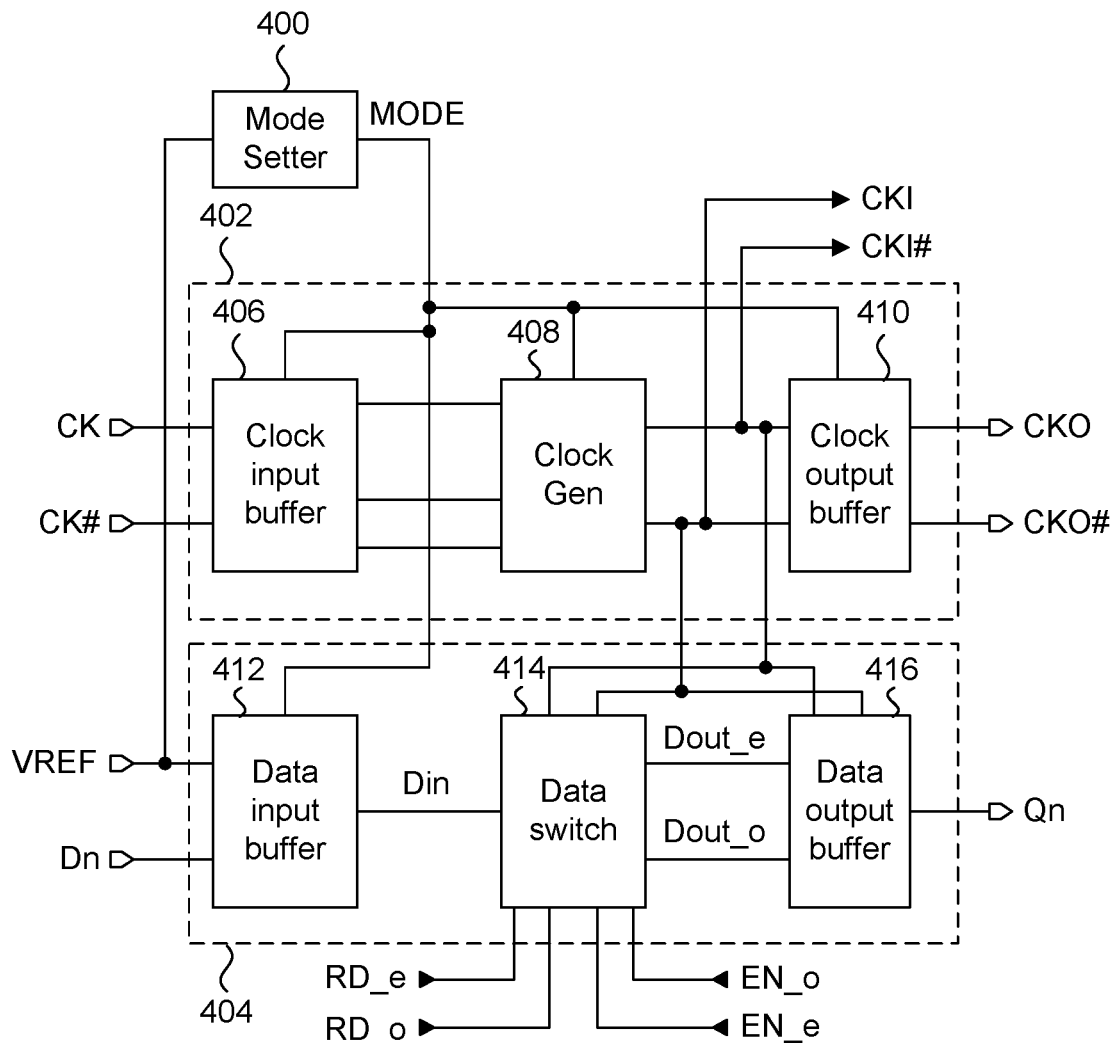
FIG. 5 is a block diagram illustrating a configurable input circuit embodiment usable in the serial memory systems of FIGS. 3A and 3C.

FIG. 5 is a block diagram illustrating a clock mode configuration circuit according to one embodiment, which generates signals to be used by an embodiment of a configurable input/output buffer. Both the clock mode configuration circuit and the configurable input buffer can be used in the previously described serial interface and control logic block 308. The clock mode configuration circuit includes a mode setter 400 and a clock switch circuit 402. The mode setter 400 generates a mode signal MODE having either a high logic level or a low logic level in response to a voltage level of a reference voltage VREF. As previously noted by example, VREF is used by the memory device to determine the logic level of high speed input signals, such as those using the HSTL signaling format. In the present embodiment, VREF will be set to some predetermined voltage level between the high and low voltage supply levels, such as VDD/2 for HSTL signaling for example. If lower speed input signals are to be used, such as those using the LVTTL signaling format, then the VREF voltage is not required, and the VREF pin can be connected to either supply voltage level (VDD or VSS). From this point on, the HSTL and LVTTL signaling formats will be used to describe the operation of the embodiments, and VREF will be set to VSS when the memory device is to receive LVTTL signals. The clock switch circuit 402 is responsible for enabling generation of internal clock signals based on one of a parallel clock signal or a source synchronous serial clock signal, in response to the mode signal MODE provided by the mode setter 400. A further discussion of the components of the clock switch circuit 402 will follow later.

The configurable input/output buffer of FIG. 5 is implemented as a configurable data input/output buffer 404 that will sense HSTL or LVTTL input signals and pass either the received input signals or internal data from the memory device, to the output port Qn. The configurable data input/output buffer 404 will use the internally generated clock signals provided by clock switch circuit 402 in order to maintain synchronous operation in accordance with the selected input signaling format. While only one configurable input/output buffer is shown in FIG. 5, persons of skill in the art will understand that there is one configurable input/output buffer for input signals DSI and CSI as well.

In the present example embodiments, VREF at the predetermined voltage level, typically VDD/2, will correspond to a serial clock mode of operation, while VREF at the VSS voltage level will correspond to a parallel clock mode of operation. This means that during assembly of the memory system, if each memory device receives the clock signal in series as in FIG. 3A, then VREF will be set to the predetermined voltage level. Accordingly, the HSTL signaling format will be used. On the other hand, if each memory device receives the clock signal in parallel as in FIG. 3C, then VREF will be set to VSS. Then the LVTTL signaling format will be used instead. Therefore, VREF is sensed by mode setter 400 to set signal MODE to a first logic state corresponding to a serial clock mode of operation or to a second logic state corresponding to a parallel clock mode of operation.

Returning to the clock switch circuit 402 with this understanding of the MODE signal, clock switch circuit 402 includes a clock input buffer 406, a clock generator 408, and a clock output buffer 410. The clock input buffer 406 is connected to the clock input ports CK and CK #, and generates either a single ended clock signal based on two differential clock inputs CK and CK #, or separate buffered versions of CK and CK # in response to the logic state of the mode signal MODE. For example, the single ended clock signal is generated when MODE is at the first logic state. The clock generator 408 receives either the single ended clock signal or the buffered versions of CK and CK # to provide two internal clock phases used for internal operation and generating the proper output timing. The internal clock signals CKI and CKI # are distributed to the internal circuits of the memory device, and to the configurable input/output buffers. The clock output buffer 410 receives the internal clock signals CKI and CKI #, and drives them through the CKO and CKO # output port when MODE is at the first logic state. When MODE is at the second logic state corresponding to a parallel mode of operation, the clock output buffer 410 is disabled since there is no need to provide the serial clock to the next memory device.

The configurable data input/output buffer 404 includes a data input buffer 412, a data switch 414, and a data output buffer 416. The data input buffer 412 receives input data Dn and the reference voltage VREF, which is used when MODE is at the first logic level. A buffered input signal Din is then provided to the data switch 414, which passes either Din or native data from the memory device, to the data output buffer 416. The native data in the present example includes even data RD_e and odd data RD_o, because data is provided on both the rising and falling edge of the clock signal. Signals EN_o and EN_e are used to select Din or both RD_e and RD_o to pass to the data output buffer 416. Furthermore, it is noted that the serial data of Dn is provided on both the rising and falling edge of the clock signal. The selection of which data to pass will depend on the command received by the memory device. In either case, the data is synchronized to the internal clock signals CKI and CKI # and passed to the data output buffer as even and odd data Dout_e and Dout_o respectively. The data output buffer 416 will then interleave the Dout_e and Dout_o bits of data in response to the clock and drive it through the Qn data output port.

An advantage provided by the clock mode configuration circuit of FIG. 5 is that no additional package pin is required because VREF is now used for two different purposes. If each memory device is individually packaged, then the package size is thereby minimized by reducing the number of pins that are required. Those skilled in the art will understand that smaller package sizes minimize required printed circuit board area upon which the memory system is integrated upon. Alternately, the memory devices of the serial memory systems shown in FIGS. 3A and 3C can be packaged together as a system in package (SIP). Once again, a reduced pin count will minimize the package size. The mode setter 400 being connected to the VREF input port provides this advantage. A further advantage is that a single memory component can operate correctly in high performance source synchronous clocking configurations, and in lower performance parallel clocking configurations with reduced power consumption, as will be further explained as follows.

Figure 6:
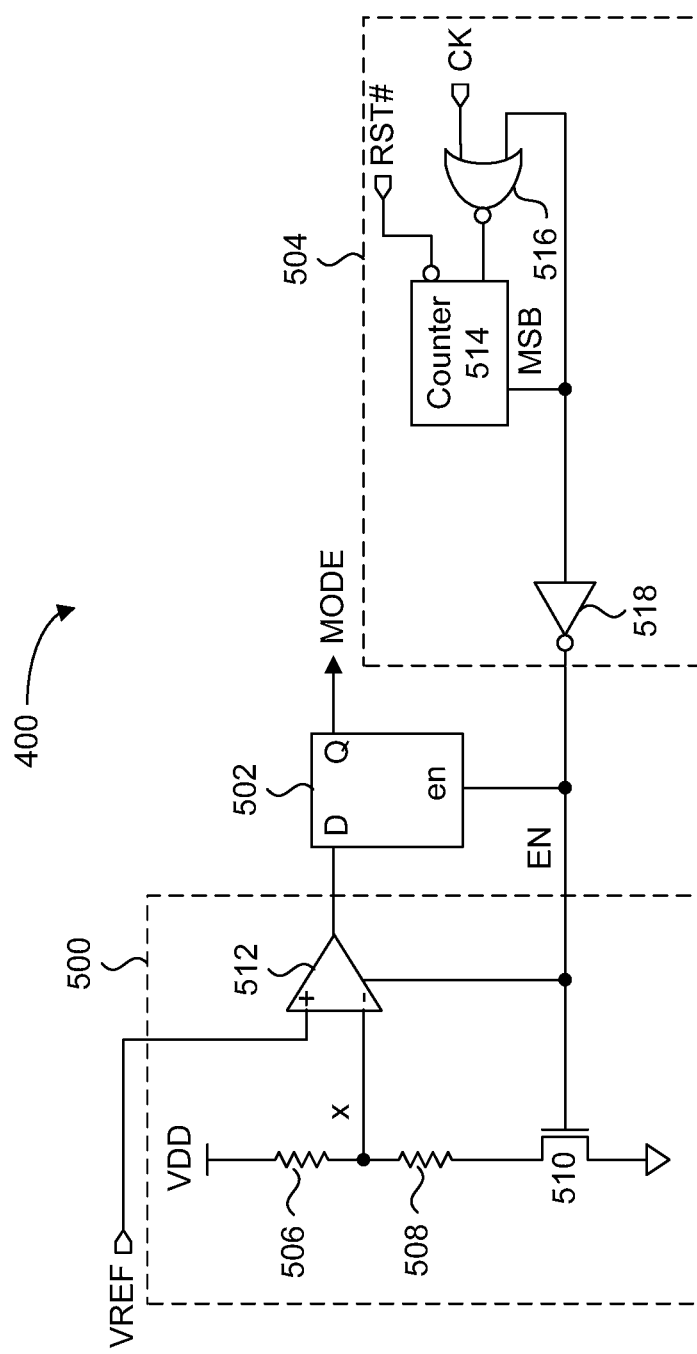
FIG. 6 is a circuit schematic embodiment of the mode setter of FIG. 5.

FIG. 6 is a circuit schematic of the mode setter 400, according to one embodiment. Mode setter 400 will sense the voltage level of VREF and drive signal MODE to either a first logic level or a second logic level. In this particular example, the first and second logic levels can correspond to VDD and VSS respectively. Mode setter 400 includes a sense circuit 500, a latch 502, and a digital delay circuit 504. The sense circuit 500 includes resistor elements 506, 508, a power shut-off device 510 connected in series between VDD and VSS, and a comparator 512. In the present embodiment, power shut-off device 510 is implemented as an n-channel transistor having a gate terminal receiving an enable signal EN. The shared terminal of resistor elements 506 and 508 is connected to one input of comparator 512, while a second input of comparator 512 receives the reference voltage VREF. Resistor elements 506 and 508 form a reference voltage circuit. The ratio of resistor elements 506 and 508 can be set depending on the value of VREF to be detected. For example, if the stable voltage level of VREF is to be VDD/2, then resistor element 506 can be set to 3R while resistor element 508 can be set to R. Accordingly, the shared terminal "x" will be at approximately VDD/4. The comparator 512 can be implemented with any known circuit, and in the present example, includes an optional enable input for receiving the enable signal EN.

The latch 502 can be implemented with any known circuit, and in the present example optionally receives enable signal EN. When the latch enable input is high the signal appearing on the D input is provided at the Q output. When the latch enable input transitions from high to low, the state of the D input is latched and provided to the output Q. The digital delay circuit 504 includes a counter 514, a NOR logic gate 516, and an inverter 518. The counter 514 is an n-bit counter, where n can be any integer number greater than 1, having only its most significant bit output (MSB) connected to the input of inverter 518. The counter is reset such that all bits, including the MSB output, are set to 0 (VSS) when RST # is at the low logic level. MSB is also connected to one input of NOR logic gate 516, while its other input receives clock signal CK. Therefore, when reset, MSB is at VSS in the present example. When RST # is released by setting it to the high logic level, the counter is permitted to increment the count with each rising or falling edge of the clock CK. When the MSB is toggled to 1 (VDD), then power shut-off device 510 is turned off via inverter 518, the comparator 512 is turned off to save power, the MODE output is latched, and the clock input of the counter 514 is disabled via the NOR gate to freeze the counter 514. After the delay provided by the counter, MODE will be stably set to either VDD or VSS.

Figure 7:
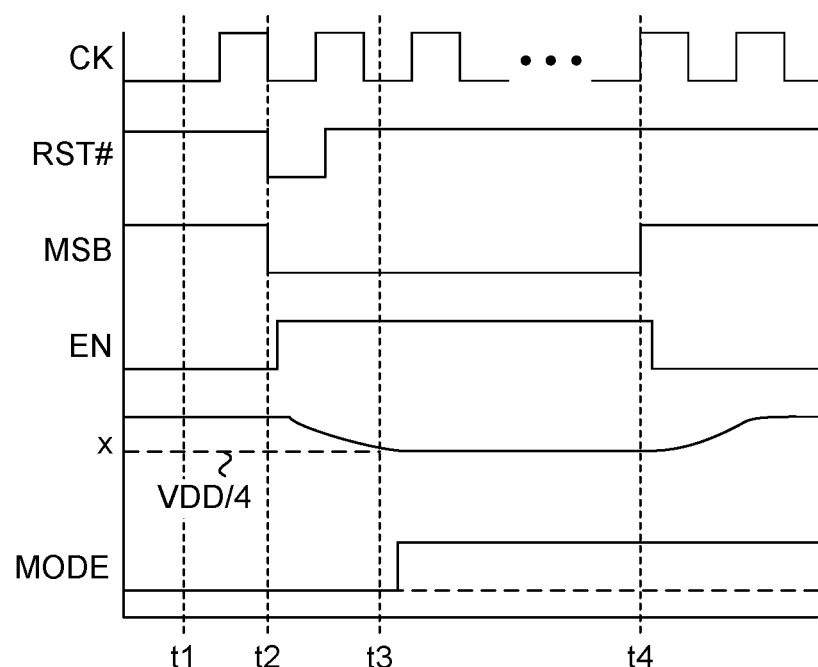
FIG. 7 is a sequence diagram illustrating the operation of the mode setter of FIG. 6.

The operation of mode setter 400 is now described with reference to the sequence diagram of FIG. 7. At time t1, RST # is at VDD, which results in counter 514 driving MSB to VDD. EN is then driven to VSS by inverter 518, which turns off power shut-off device 510 to allow node "x" to float to VDD. The advantage of having node "x" float to VDD while the circuit is disabled is that regardless of the value of VREF, MODE will immediately default to VSS when comparator 512 and latch 502 are enabled, because node "x" will always be greater than VREF. This immediately sets the memory device to the parallel clock mode of operation so that normal memory operations can begin without delay. At time t2, RST # is pulsed to VSS to reset MSB to VSS. RST # returning high releases counter 514 to count a predetermined number of edges of clock signal CK to allow the analog portions of the circuit sufficient time to settle and properly determine the level on the VREF pin, even if the RST # low level pulse is short. When MSB drops to VSS, EN is driven to VDD by inverter 518 to enable the resistor divider, comparator 512, and latch 502 to evaluate the level on the VREF pin and determine the MODE of operation. Because node "x" is currently floating at VDD, the enabled comparator 512 will drive a low logic output which is then passed through latch 502 for setting MODE to the low logic level.

In the present example, it is assumed that VREF is configured to be approximately VDD/2, and the ratio of resistor elements 506/508 is 3R/R. While the circuit is enabled, the voltage at node "x" will therefore settle to a level of approximately VDD/4. Eventually, the voltage on node "x" will be established at a steady VDD/4 level as shown in FIG. 7 at time t3. If VREF is set to VSS, then no change will occur in comparator 512 to keep MODE at VSS. On the other hand, if VREF is set to VDD/2, comparator 512 will then drive its output to VDD which causes latch 502 to drive MODE to VDD around time t3. Eventually, counter 514 will set MSB to VDD at time t4 to drive EN to VSS. MSB at VDD will cause NOR logic gate 516 to output a low logic level signal to effectively terminate counting by counter 514, thereby "freezing" the counter 514. Once EN drops to VSS, power shut-off device 510 is turned off and node "x" will eventually float to VDD. However, EN at VSS will now disable comparator 512, and latch 502 is prevented from latching any changing output signal on its D input. Therefore, power is saved by turning off sense circuit 500. In the source synchronous mode of operation, normal memory operations can begin only after PLL or DLL synchronization. This time is not wasted since the voltage at node "x" will settle to the correct value during this synchronization period.

Therefore, the time delay corresponding to the time for counter 514 to toggle MSB to VDD will be sufficiently long to ensure that node "x" and VREF have stabilized for sensing by comparator 512. By example only, a 1 ms time delay may be a sufficient time delay provided by digital delay circuit 504. Hence by turning off power shut-off device 510 after MSB is toggled to VDD, the current path from VDD through the resistor elements 506 and 508 to VSS is cut off, thereby conserving power during operation of the memory device. This time delay can be selected based on the clock frequency being applied and the number of bits in the counter 514.

Figure 8A:
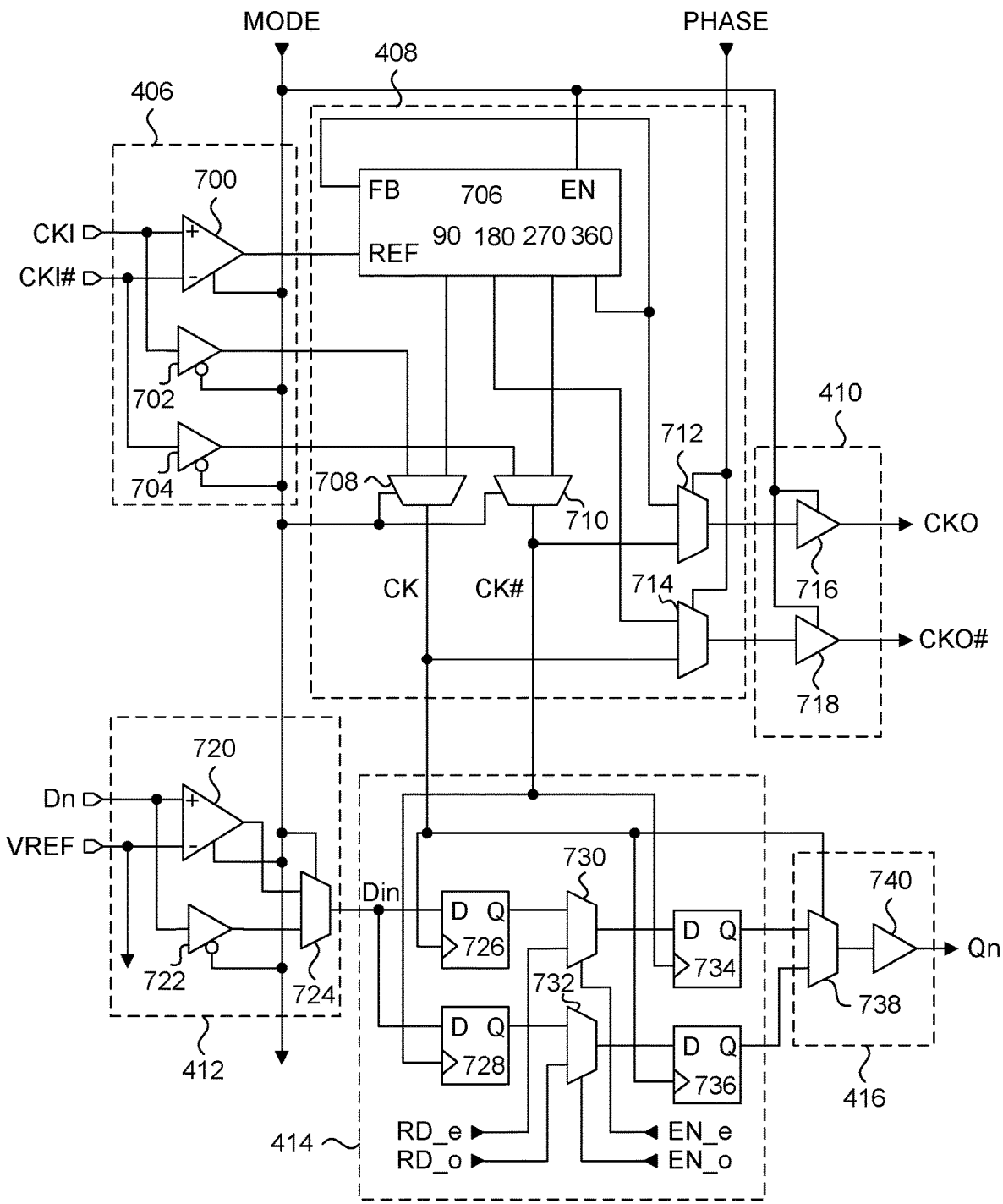
FIG. 8A is a schematic embodiment of the configurable input circuit shown in FIG. 5.

FIG. 8A is a schematic embodiment of the clock switch circuit 402 and the configurable data input/output buffer 404 of FIG. 5. Both circuits can be referred to as a configurable input circuit, since one receives an input clock and the other receives input data from at least one input data port. The clock switch circuit 402 is configurable to operate in the parallel or serial clock modes in response to a logic state of the mode signal MODE, while the configurable data input/output buffer 404 is configurable to receive input data in either the HSTL or LVTTL signaling format in response to the logic state of MODE. It is noted that this Dn input can receive both write data and commands from a memory controller. In order to simplify the circuit schematic of FIG. 8A, the command data path and the input write data path are not shown. The same numbered reference numbers appearing in FIG. 8A have been generally described in FIG. 5.

The details of the clock switch circuit 402 now follows. The clock input buffer 406 includes a comparator 700 for receiving complementary clock signals from clock input ports CKI and CKI #, a first buffer circuit 702 receiving a clock signal from clock input port CKI and a second buffer circuit 704 receiving a complementary clock signal from clock input port CKI #. Comparator 700 is enabled by one state of MODE while the first and second buffers 702 and 704 are both enabled by an opposite state of MODE. Thus, only one of the comparator 700 and the buffers 702 and 704 will be active for any single logic state of MODE. However, the outputs of comparator 700 and buffers 702 and 704 are coupled to clock generator 408 in parallel. For the presently described example where mode setter 400 sets MODE to the first logic state corresponding to the serial clock mode of operation and to a second logic state corresponding to the parallel clock mode of operation, MODE at the first logic state will enable comparator 700. Accordingly, MODE at the second logic state will enable first and second buffers 702 and 704.

Clock generator 408 includes a phase locked loop (PLL) circuit 706 that is enabled when MODE is at the first logic state. When enabled, PLL circuit 706 will generate clock outputs shifted by 90, 180, 270 and 360 degrees relative to the clock signal received at its REF input, which is connected to the output of comparator 700. These shifted clock outputs are provided from the terminals labeled 90, 180, 270 and 360. In the serial clock mode of operation, received input clock transitions and received input data transitions are coincident. The PLL circuit 706 is used to place the edges of the internal clock signals within the input data valid window, for reliable data capture. A feedback input FB receives the 360 degree shifted clock output to facilitate locking of the clock signals. Those skilled in the art should be familiar with PLL circuit operation, and that the clock will be locked after several clock cycles to ensure stable operation. Instead of a PLL, a delayed lock loop (DLL) circuit can be used in place of the PLL circuit 706. A PLL and a DLL are both examples of clock synthesizers which can be used in the disclosed embodiments. The 90 and 270 degree clock outputs are provided to first inputs of 2-1 multiplexors 708 and 710, both being controlled by MODE. The second inputs of multiplexors 708 and 710 receive the outputs of buffers 702 and 704 respectively. In the parallel clock mode of operation, the received input clock transitions will be within the input data valid window so that no phase shifted clocks are required. Therefore, multiplexors 708 and 710 collectively form a switch circuit for selectively passing one of the 90 and 270 degree clock outputs from PLL circuit 706 and the buffered clock signals from buffers 702 and 704 in response to MODE. In the present example when MODE is at the first logic level, PLL circuit 706 is enabled and multiplexors 708 and 710 will be controlled to pass the 90 and 270 degree clock outputs as internal clock signals CK and CK #. On the other hand, when MODE is at the second logic level, PLL circuit 706 is disabled and multiplexors 708 and 710 will be controlled to pass the clock signals from buffers 702 and 704 as the internal clock signals CK and CK #. Accordingly, turning off the PLL that is not being used will reduce power consumption.

While not explicitly shown in FIG. 8A, complementary internal clock signals CK and CK # are distributed to other circuits within the memory device. An optional feature of clock generator 408 is the phase selector circuit that includes multiplexors 712 and 714. First inputs of multiplexors 712 and 714 receives the internal clock signals CK # and CK respectively, while second inputs receive the 360 and 180 degree clock outputs from PLL circuit 706. Both multiplexors 712 and 714 are controlled by signal PHASE, which is provided by the command decoder of the memory device. The purpose of the phase selector circuit is to centre the output clock signals provided on output ports CKO and CKO # with the output data provided on the output port Qn. In a serially connected memory system, this feature is enabled in the last memory device of the system. The advantage is that the memory controller design can be simplified as it will not require a PLL or DLL to reliably receive the data from the last memory device in the ring. Further details of the application of this feature in a memory system will be described later. The clock output buffer 410 includes a pair of drivers 716 and 718 for driving the clock signals provided by multiplexors 712 and 714 onto output ports CKO and CKO #. Both drivers 716 and 718 are enabled by MODE, when it is at the first logic level representing the serial clock mode for example.

Therefore, in response to MODE, clock switch circuit 402 is configured to generate internal clock signals corresponding to a serially provided source synchronous clock signal or to a parallel clock signal. Because the memory devices will operate at high speeds in response to a high speed source synchronous clock signal, this mode can be referred to as a high speed mode of operation. On the other hand, because the parallel clock signals will be at a lower frequency than the source synchronous clock, the other mode can be referred to as a low power mode of operation since circuits such as the comparator 700, PLL 706, and drivers 716 and 718 will be turned off, and the lower frequency operation reduces overall power consumption relative to when the memory device operates at high frequencies. In either mode of operation, the internal clock signals CK and CK # will be generated for use by other circuits of the memory device, such as the configurable data input/output buffer consisting of data input buffer 412, data switch 414 and data output buffer 416.

The data input buffer 412 includes a comparator 720, a buffer circuit 722 and a data input selector 724, where the data input selector 724 is implemented as a 2-1 multiplexor. Comparator 720 has one input connected to input port Dn, and a second input connected to the reference voltage input port VREF. The buffer circuit 722 is also connected to input port Dn. Comparator 720 generates a logic output corresponding to the voltage level of Dn relative to VREF, while buffer circuit 722 drives a logic level corresponding to what it receives. All three circuits are controlled by MODE, and in the presently described example where MODE being at the first logic level corresponds to a high speed mode of operation, comparator 720 is enabled, buffer 722 is disabled, and data input selector 724 is controlled to pass the output of comparator 720. The output of data input selector 724 is referred to as Din.

Since the memory devices of the present embodiments are to be serially connected to each other, external data arriving at the Dn input port can be selectively passed through a memory device to the designated, or addressed, memory device. However, each memory device can also provide local read data that is to be passed on to the memory controller through any intervening memory devices. The purpose of data switch 414 is to selectively pass either external Dn data or local read data to the output port Qn. The data switch 414 includes external data input latches 726 and 728, data output selectors 730 and 732, and output latches 734 and 736. In the present embodiment, data is latched on both edges of the internal clock CK. Therefore, latches 726 and 728 receive CK and CK # respectively. Data output selector 730 passes one of latched external data from data input latch 726 or local even read data RD_e in response to select signal EN_e. Similarly, data output selector 732 passes one of latched external data from data input latch 728 or local odd read data RD_o in response to select signal EN_o. Select signals EN_e and EN_o are provided by the command decoder of the memory device.

The data output latches 734 and 736 latch the outputs of output selectors 730 and 732 in response to active edges of the internal clock signals CK # and CK respectively. The operation of the data switch 414 is well understood by those of skill in the art familiar with double data rate operation. The data output buffer 416 includes a data output selector 738 implemented as a 2-1 multiplexor, and a driver 740. Data output selector 738 alternately passes the outputs of data output latches 734 and 736 in response to CK, which is then provided onto output port Qn by driver 740. In summary, when MODE is set, the data input buffer 412 is automatically configured to receive a corresponding data signal format, and the appropriate internal clock signals are automatically generated by clock switch circuit 402 for use by data switch 414 and data output buffer 416.

Therefore, the same memory devices connected in series in a ring topology with a memory controller can be configured to receive either a parallel clock or a source synchronous clock in series in response to a reference voltage that is used for sensing data signal voltage levels, as shown in FIGS. 3A and 3C. Furthermore, data input circuits are automatically configured to receive data signals having a signaling format that corresponds with the parallel clock and the source synchronous clock. Although not shown, the output buffer drive strength can also be configured based on the MODE setting, to optimize performance and power in the multi-drop bus and point-to-point ring topologies.

As previously discussed, each memory device can include the optional phase selector circuit that includes multiplexors 712 and 714 shown in FIG. 8A. In use with the memory system of FIG. 3A for example, only the last memory device 110 will have PHASE set to a logic level for passing the 180 and 360 degree clock outputs from PLL 706. For example, all memory devices except the last memory device in the ring will output the 90 and 270 degree clocks, which are the same clocks used to generate output data transitions. Therefore, output clock edges and output data edges are co-incident and fully compatible with the input sampling stages of the next memory device. If the controller does not have a PLL or DLL to shift the input clock edges to the middle of the input data valid window, the PHASE bit can be set to provide output clock transitions already positioned in the middle of the data valid window, so that the controller can sample received data directly with the received clock signal. In the present examples, these would be the 180 and 360 degree degree clock outputs. Signal PHASE can be set by loading a single bit register from a command received by the memory device. This would be set during a power up sequence of the memory system, which would start with the memory controller 202 executing an algorithm for assigning addresses to each memory device. Such algorithms can include the ones disclosed in the previously mentioned commonly owned U.S. Patent Applications which are directed to generating ID numbers for memory devices in the memory system.

During ID number assignment, all memory devices will have the PHASE bit set to output co-incident clock and data edges. In the present embodiments for example, this can correspond to a default state of PHASE in which the 90 and 180 degree clocks are output. If the memory controller does not have a PLL or DLL, then it will not be able to properly receive data until PHASE of the last memory device has been properly programmed. However, since devices will not output any data transitions at all until their device addresses have been assigned, the memory controller will recognize transitions on its data input as an indication that the last memory device has been programmed with a device address. Once the last memory device in the system is known by the memory controller, a command is issued to set the aforementioned single bit register that changes the default state of PHASE to one for passing the 180 and 360 degree clock outputs. After this setting has taken effect full communication around the ring can occur.

Figure 8B:
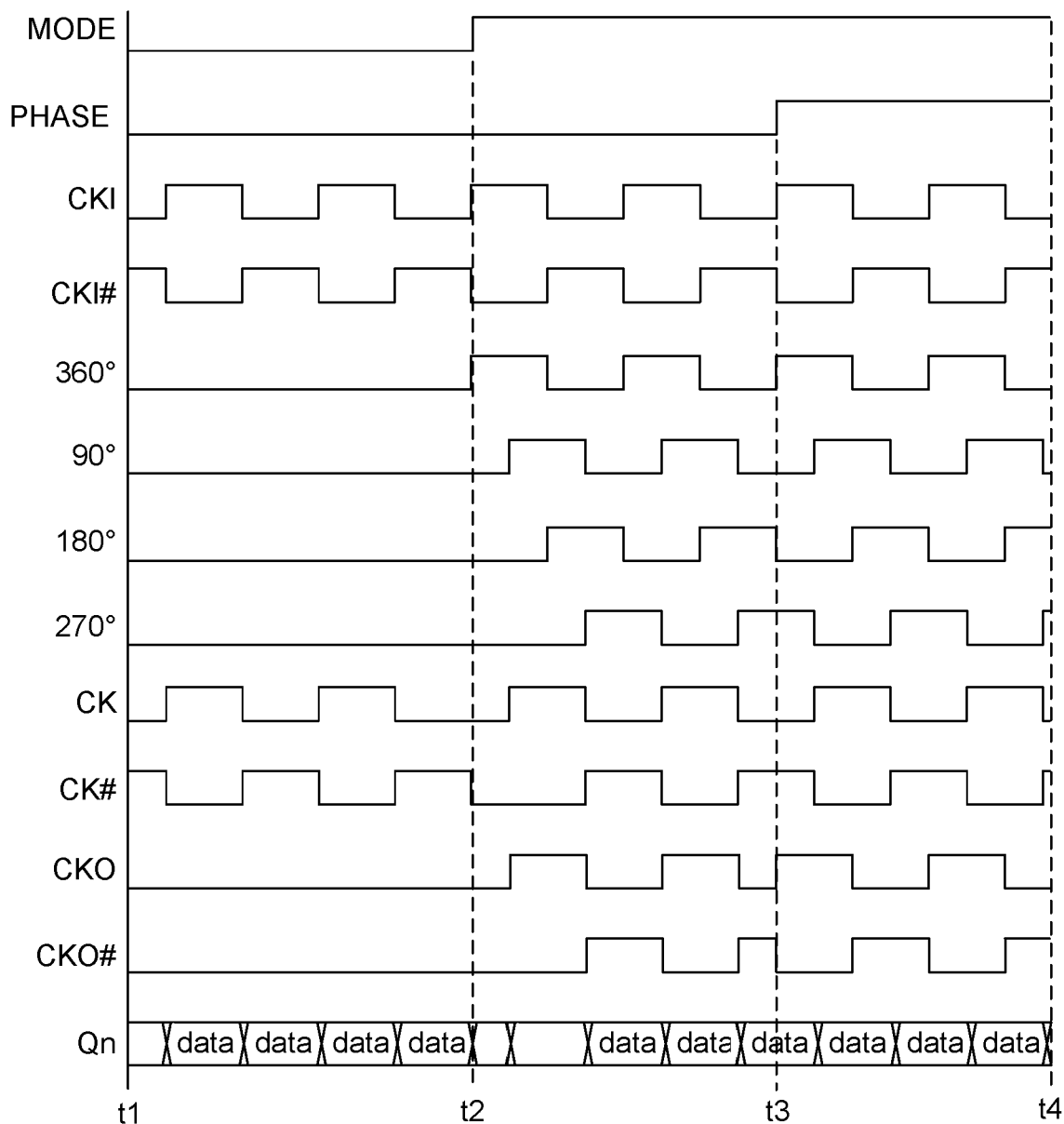
FIG. 8B is a timing diagram showing the operation of the circuits of FIG. 8A.

FIG. 8B is a timing diagram showing the operation of the circuits of FIG. 8A. In particular, the timing diagram of FIG. 8B shows the internally generated clock signals in response to different settings of MODE and PHASE during a continuous sequence of CKI and CKI # clock transitions. At the same time, hypothetical data on the Qn output port is shown to contrast timing differences relative to the output data valid windows in response to different logic levels of MODE and PHASE. This timing diagram is merely illustrative of the behaviour of the circuits of FIG. 8A. Those skilled in the art will understand that data would not be provided proximate to transitions of MODE and PHASE during actual use. Dynamic transitions of MODE and PHASE would be done during an initialization or reset period of the memory system. FIG. 8B includes signal traces for MODE, PHASE, CKI and CKI #, the internally generated 90, 180, 270 and 360 degree clock signals from the clock synthesizer, CK and CK # and CKO and CKO #.

In the time period between time t1 and t2, the circuit is operating in the parallel clock mode when MODE is at a low logic level. Because MODE is at the low logic level, PLL circuit 706 is turned off resulting in its 90, 180, 270 and 360 clock outputs being set to the low logic level. The internal clocks CK and CK # are therefore buffered versions of CKI and CKI # respectively. Using the circuits shown in FIG. 8A, the data transfer operation between the input Dn (not shown) and Qn will follow the same sequence as shown in FIG. 3D, except that the latching operations are now responsive to CK and CK # instead of directly to CKI and CKI #. With MODE at the low logic level, the clock output buffer 410 is disabled to keep CKO and CKO # at the low logic level.

In the time period between time t2 and t4, the circuit is operating in the serial clock mode when MODE is at a high logic level. Because MODE is at the high logic level, PLL circuit 706 is turned on to generate the 90, 180, 270 and 360 clock outputs. The current timing diagram assumes that mode reset and PLL locking is immediate. With MODE at the high logic level, internal clocks CK and CK # will correspond to the 90 and 270 degree clock outputs, and the clock output buffer 410 is enabled to drive CKO and CKO # with the CK and CK # clocks. Using the circuits shown in FIG. 8A, the data transfer operation between the input Dn (not shown) and Qn will follow the same sequence as shown in FIG. 3B, except that the latching operations are now responsive to CK and CK # instead of directly to the 90 and 270 degree clock outputs.

At time t3 PHASE is at the high logic level, but in actual use PHASE is set to either the high or low logic level before normal operations of the memory device. The transition shown in FIG. 8B merely contrasts the relationship between rising and falling edges of CKO and CKO # relative to the output data of Qn between different logic levels of PHASE. With PHASE set to the high logic level, multiplexors 712 and 714 will pass the 180 and 360 degree clock outputs to the clock output buffer 410. Accordingly, CKO and CKO # will correspond to the 180 and 360 degree clock outputs, thereby centering the clock edges within the data valid windows.

Figure 9:
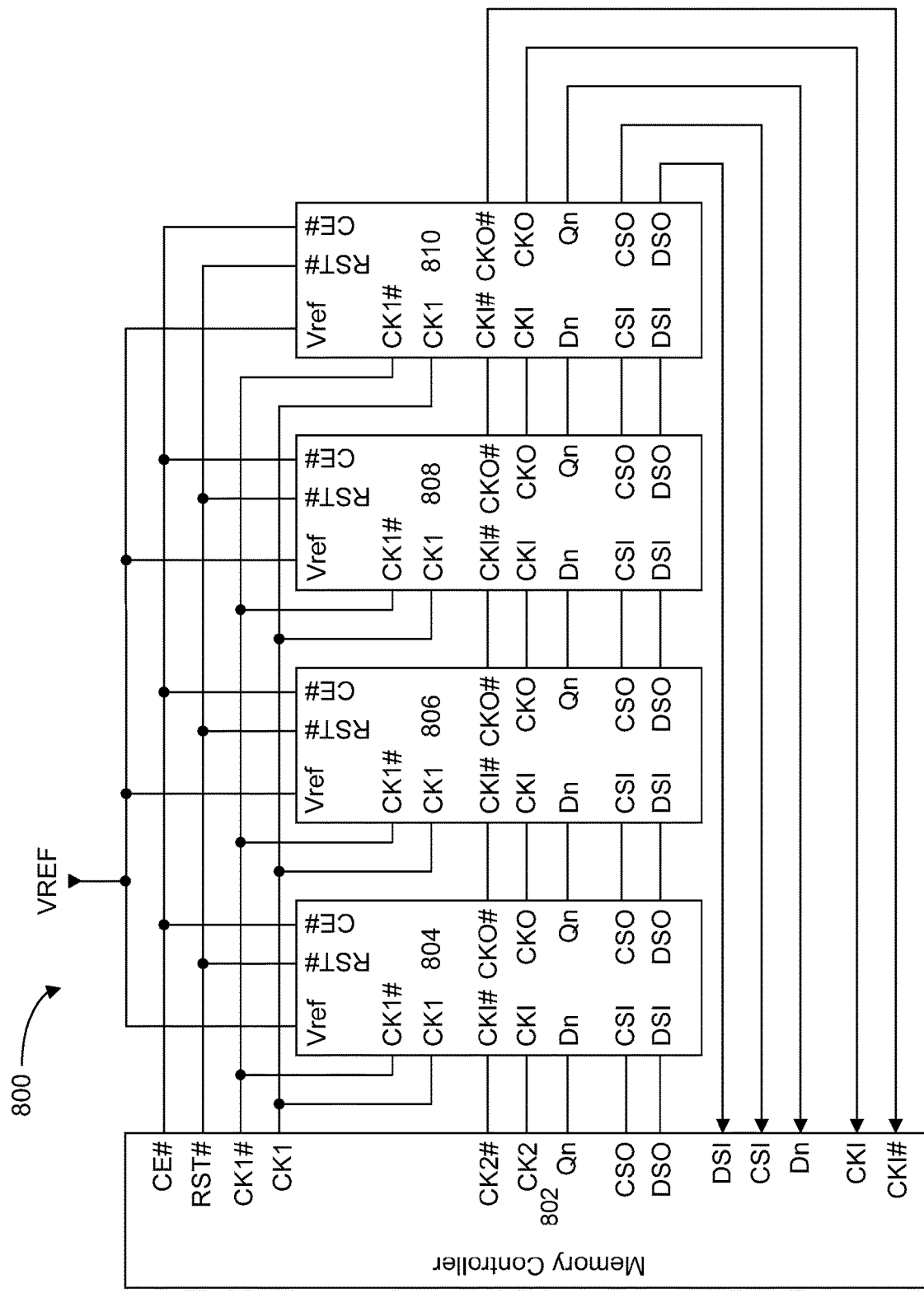
FIG. 9 is a block diagram of an embodiment of a dynamically configurable serial memory system.

The system embodiments of FIGS. 3A and 3C are static, meaning that once manufactured or assembled for use, they cannot be changed. According to another embodiment, the memory system can be dynamically changed such that the memory devices receive either a parallel clock or a source synchronous clock in series. FIG. 9 is a an embodiment of a dynamically configurable serial memory system where the memory controller provides both parallel and source synchronous clocks, and data signals in signaling formats corresponding to the type of clocks. The memory devices will include the same circuits shown in FIG. 8A, with a minor modification to receive both parallel and source synchronous clock signals.

In FIG. 9, configurable serial memory system 800 includes a memory controller 802, and four dynamically clock configurable memory devices 804, 806, 808 and 810. Memory controller 802 provides the same control and data signals as memory controller 102 or 202, but now provides parallel complementary clocks through clock output ports CK1 and CK1 #, and complementary source synchronous clocks through clock output ports CK2 and CK2 #. Memory controller 802 is further configured to dynamically provide data and the strobe signals through its Qn, CSO and DSO output ports in one signaling format corresponding to the parallel clock, and another signaling format corresponding to the source synchronous clock. For example, LVTTL signaling can be used with the parallel clock while HSTL signaling can be used with the source synchronous clock. Memory controller 802 further includes serial clock input ports CKI and CKI # for receiving the source synchronous clocks from the last memory device. Each memory device is similarly configured to the memory devices shown in FIGS. 3A and 3C, except that each now includes a parallel input clock ports CK1 and CK1 # and serial input clock ports CKI and CKI #. Depending on the level of VREF, each memory device will selectively use either the parallel clocks or the source synchronous clocks.

FIG. 10 is a schematic showing details of a clock switch circuit 402 according to an alternate embodiment. This clock switch circuit shows a modification to the clock switch circuit shown in FIG. 8A, where elements that are the same share the same reference numerals. The only difference over the embodiment of FIG. 8A is that clock input buffer 406 now includes comparator 900, first buffer circuit 902 and second buffer circuit 904 that replace comparator 700, first buffer circuit 702 and second buffer circuit 704 of FIG. 8A. Comparator 900 has its inputs connected to clock input ports CKI and CKI # that are dedicated to receiving complementary source synchronous clock signals. The first buffer circuit 902 and second buffer circuit 904 are connected to clock input ports CLK1 # and CK1 that are dedicated to receiving complementary parallel clock signals. Now each memory device can be physically connected to both parallel and source synchronous clocks at the same time. The voltage level of VREF will then determine which of the clock inputs are to be used. In the memory system embodiment of FIGS. 9 and 10, VREF can now be controlled by the memory controller, or alternatively by some suitable circuit separate from the memory controller that is controllable to drive VREF to the predetermined voltage level, or to either supply voltage. Therefore, the memory system illustrated in FIGS. 9 and 10 can be dynamically switched to operate with the source synchronous clocks for high speed operation, or with the parallel clocks if low power consumption operation is desired.

Figure 11:
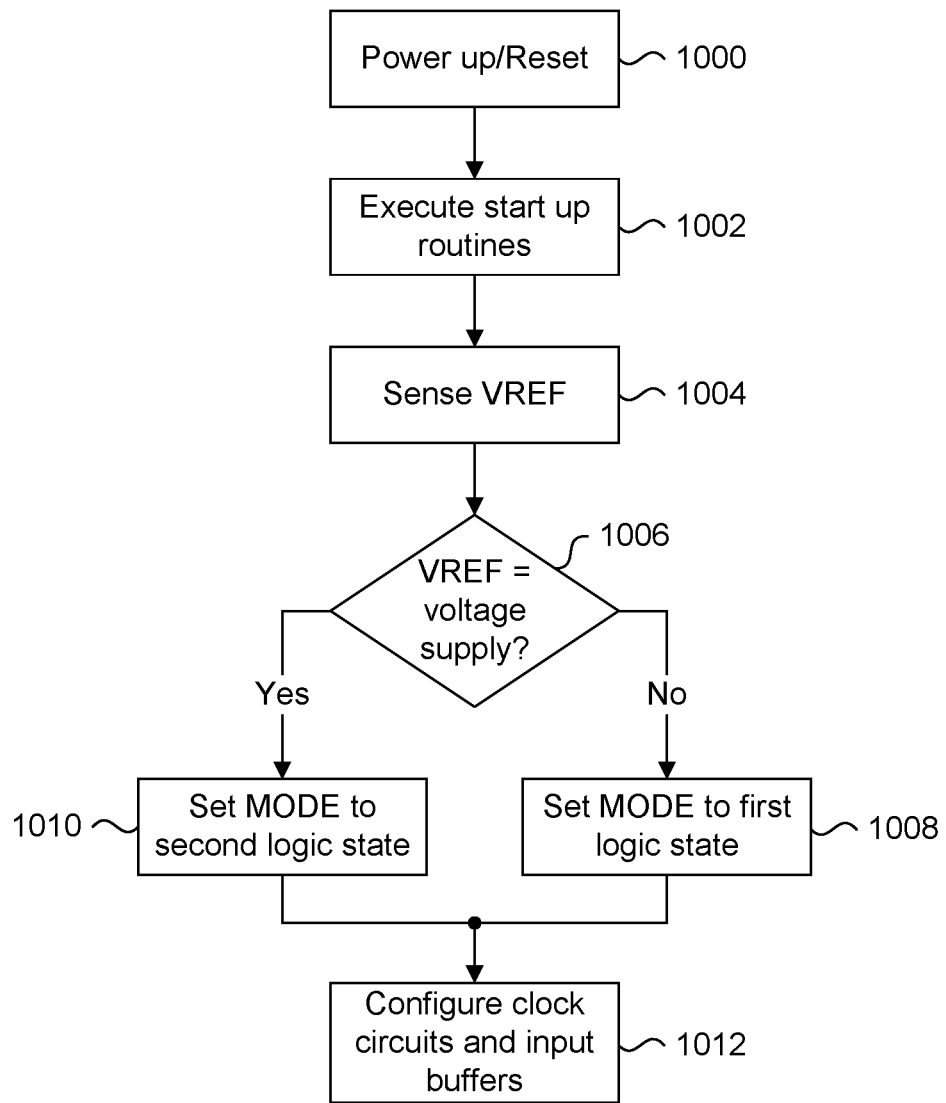

FIG. 11 is a flow chart summarizing the general algorithm executed by both the memory controller and the memory devices of the memory systems shown in FIGS. 3A, 3C and 9 for setting an operating mode. The method begins at step 1000 where the memory system is powered up, or reset by asserting the reset signal RST #. At step 1002 the memory controller will execute start-up algorithms, such as an algorithm to assign device ID numbers to each memory device in the memory system. At power up or reset, VREF will be set to a power supply voltage or to a predetermined voltage level. It should be understood to those skilled in the art that other start-up algorithms can be executed by the memory controller and the memory devices themselves. Each memory device will then sense the level of VREF at step 1004, via their respective clock input buffers, such as the clock input buffer 406 shown in FIG. 8A. The level of VREF is then determined at step 1006, and if it is not a reference voltage, then it should be either the VDD or VSS voltage supply, and MODE is set to a first logic level at step 1008. Otherwise, VREF is the predetermined reference voltage level and MODE is set to a second logic level at step 1010.

Once MODE has been set, then all the memory devices will automatically configure their clock switch circuits and configurable data input/output buffers, such as clock switch circuit 402 and configurable data input/output buffer 404, in the manner previously described at step 1012. Once the memory devices have been configured to receive clock and data signals corresponding to MODE, then as an optional step, the memory controller can issue a command to switch PHASE of the last memory device from a default value to an active level. With reference to FIG. 8A, the default value of PHASE at start-up or reset of the memory device can be a low logic level to pass CKI and CKI #, while an active value can be VDD for passing the 180 and 360 degree clock outputs of PLL 706.

While the previously described embodiments are directed to serial memory devices, they can be applied to any semiconductor device that operates with a clock provided in parallel or in series.

In the preceding description, for purposes of explanation, numerous details are set forth in order to provide a thorough understanding of the embodiments of the invention. However, it will be apparent to one skilled in the art that for any particular embodiment of the invention, not all described details are required in order to practice that embodiment of the invention. In some instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Certain adaptations and modifications of the described embodiments can be made. Therefore, the above discussed embodiments are considered to be illustrative and not restrictive.

What is claimed is:

1. A configurable flash memory device having a plurality of operating modes, the configurable flash memory device comprising:
    a plurality of flash memory banks, each flash memory bank comprising a plurality of erasable blocks;
    a first clock input port configured to receive a first clock input signal;
    a second clock input port configured to receive a second clock input signal, the second clock input signal being complementary to the first clock input signal;
    a clock input buffer configured to receive the first clock input signal and the second clock input signal as differential clock input signals;
    a first clock output port configured to transfer a first clock output signal;
    a second clock output port configured to transfer a second clock output signal, the second clock output signal being complementary to the first clock output signal;
    a clock output buffer configured to transfer the first clock output signal and the second clock output signal as differential clock output signals, wherein the first clock output signal is referenced to the first clock input signal, and the second clock output signal is complementary to the first clock output signal;
    a voltage input port configured to receive an external reference voltage signal;
    an n-bit data input buffer, where n is a non-zero integer, configured to receive n-bit data signals carrying, at different times, command data, address data, and write data, the n-bit data input buffer initially configured to determine logic levels of the n-bit data signals independently from the external reference voltage signal when the configurable flash memory device is powered up, and further configurable to utilize the external reference voltage signal during a power up initialization period for determining the logic levels of the n-bit data signals when the configurable flash memory device is configured to be operable at a first one of the plurality of operating modes; and
    an n-bit data output buffer configured to transfer a read data retrieved from the one of the plurality of erasable blocks, the read data synchronized with the first clock output signal and the second clock output signal in a double data rate configuration, the n-bit data output buffer configurable to one of a plurality of output buffer drive strengths when the configurable flash memory device is configured to be operable at the first one of the plurality of operating modes.

2. The configurable flash memory device of claim 1, further comprising:
    a mode setting unit configured to select one of the plurality of operating modes in response to a received voltage level of the external reference voltage signal when the configurable flash memory device is in the power up initialization period.

3. The configurable flash memory device of claim 1, wherein the n-bit data input buffer is further configurable to determine logic levels of the n-bit data signals independently from the external reference voltage signal during the power up initialization period when the configurable flash memory device is configured to be operable at a second one of the plurality of operating modes.

4. The configurable flash memory device of claim 1, further comprising:
    a configuration register configured to store the plurality of output buffer drive strengths to be utilized by the n-bit data output buffer.

5. The configurable flash memory device of claim 1, further comprising:
    a configuration register configured to indicate which operating mode is configured from the plurality of operating modes.

6. The configurable flash memory device of claim 1, wherein the first one of the plurality of operating modes is a high speed operating mode.

7. The configurable flash memory device of claim 1, wherein each of the erasable blocks is arranged as a NOR flash memory.

8. The configurable flash memory device of claim 1, wherein each of the erasable blocks is arranged as a NAND flash memory.

9. A method for operating a configurable flash memory device having a plurality of operating modes, the configurable flash memory device comprising an external reference voltage input port configured to receive an external reference voltage signal, an n-bit data input buffer, a first clock input port, a second clock input port, a first clock output port, a second clock output port, and an n-bit data output buffer, the method comprising:
    powering up the configurable flash memory device;
    providing the external reference voltage signal to the external reference voltage input port;
    providing a first clock input signal to the first clock input port;
    providing a second clock input signal to the second clock input port, the second clock input signal being complementary to the first clock input signal;
    providing n-bit data signals to the n-bit input buffer, the n-bit data signals carrying, at different times, command data, address data, and write data, the n-bit data input buffer configured to determine logic levels of the n-bit data signals independently from the external reference voltage signal;

configuring the n-bit data output buffer to one of a plurality of output buffer drive strengths; and with the configurable flash memory device in the first one of the plurality of operating modes, receiving read data from the n-bit data output buffer synchronized with the first clock output signal and the second clock output signal in a double data rate configuration, wherein the first clock output signal is referenced to the first clock input signal, and the second clock output signal is complementary to the first clock output signal.

10. The method of claim 9, wherein the method further comprises:

configuring the configurable flash memory device into the first one of the plurality of operating modes during the powering up initialization period by applying the external voltage to the external voltage input port at a predetermined level between high and low voltage supply levels.

11. The method of claim 10, wherein the predetermined level is lower than a main voltage Vcc.

12. The method of claim 9, wherein the first one of the plurality of operating modes is a high speed operating mode.

13. The method of claim 9, further comprising:

resetting the configurable flash memory device to a default operating mode by either of a power-up or reset sequence.

14. The method of claim 13, wherein the default operating mode is a low speed operating mode.

15. A memory system comprising:

a configurable flash memory device having a plurality of operating modes and comprising:

a plurality of flash memory banks, each flash memory bank comprising a plurality of erasable blocks;

a first clock input port;

a second clock input port;

a clock input buffer configured to receive the first clock input signal and the second clock input signal as differential clock input signals;

a first clock output port configured to transfer a first clock output signal;

a second clock output port configured to transfer a second clock output signal, the second clock output signal being complementary to the first clock output signal;

a clock output buffer configured to transfer the first clock output signal and the second clock output signal as differential clock output signals, wherein the first clock output signal is referenced to the first clock input signal, and the second clock output signal is complementary to the first clock output signal;

a voltage input port configured to receive an external reference voltage signal;

an n-bit data input buffer, where n is a non-zero integer, configured to receive n-bit data signals carrying, at different times, command data, address data, and write data, the n-bit data input buffer initially configured to determine logic levels of the n-bit data signals independently from the external reference voltage signal when the configurable flash memory device is powered up, and further configurable to utilize the external reference voltage signal during a power up initialization period for determining the logic levels of the n-bit data signals when the configurable flash memory device is configured to be operable at a first one of the plurality of operating modes; and an n-bit data output buffer configured to transfer a read data retrieved from the one of the plurality of erasable blocks, the read data synchronized with the first clock output signal and the second clock output signal in a double data rate configuration, the n-bit data output buffer configurable to one of a plurality of output buffer drive strengths when the configurable flash memory device is configured to be operable at the first one of the plurality of operating modes; and a memory controller communicatively coupled to the configurable flash memory device, the memory controller configured to:

provide a first clock input signal to the first input clock port, and a second clock input signal to the second input clock port, the second clock input signal being complementary to the first clock input signal; and configure the configurable flash memory device to be operable at the first one of the plurality of operating modes;

receive the first and second clock output signals from the first and second clock output ports, respectively; and receive the read data from the configurable flash memory device in synchronization with the first and second clock signals in a double data rate configuration.

16. The memory system of claim 15, wherein the configurable flash memory device further comprises:

a mode setting unit configured to select one of the plurality of operating modes in response to a received voltage level of the reference voltage signal when the configurable flash memory device is in the power up sequence.

17. The memory system of claim 15, wherein the n-bit data input buffer is further configurable to determine logic levels of the n-bit data signals independently from the external reference signal during the power up initialization period when the configurable flash memory device is configured to be operable at a second one of the plurality of operating modes.

18. The memory system of claim 15, wherein the configurable flash memory device further comprises:

a configuration register configured to store the plurality of output buffer drive strengths to be utilized by the n-bit data output buffer;

and wherein the memory controller is configured to configure an operating mode of the configurable flash memory device by writing to a data value to the configuration register.

* * * * *